US012811089B2

(12) United States Patent
Gamm

(10) Patent No.: US 12,811,089 B2
(45) Date of Patent: Nov. 24, 2026

(54) METHOD FOR OPERATING A PARTICLE BEAM APPARATUS, COMPUTER PROGRAM PRODUCT AND PARTICLE BEAM APPARATUS FOR CARRYING OUT THE METHOD

(71) Applicant: Carl Zeiss Microscopy GmbH, Jena (DE)

(72) Inventor: Bjoern Gamm, Koenigsbronn (DE)

(73) Assignee: Carl Zeiss Microscopy, GmbH, Jena (DE)

( * ) Notice: Subject to any disclaimer, the term of this patent is extended or adjusted under 35 U.S.C. 154(b) by 223 days.

(21) Appl. No.: 18/947,565

(22) Filed: Nov. 14, 2024

(65) Prior Publication Data

US 2025/0157782 A1 May 15, 2025

(30) Foreign Application Priority Data

Nov. 14, 2023 (DE) ......................... 102023131592.7

(51) Int. Cl.
*H01J 37/14* (2006.01)
*H01J 37/147* (2006.01)
(Continued)

(52) U.S. Cl.
CPC ...... *H01J 37/1475* (2013.01); *H01J 37/1477* (2013.01); *H01J 37/244* (2013.01); (Continued)

(58) Field of Classification Search
CPC .... H01J 37/145; H01J 37/1477; H01J 37/244; H01J 37/265; H01J 37/28; (Continued)

(56) References Cited

U.S. PATENT DOCUMENTS 7,705,300 B2 4/2010 Morokuma et al.
10,446,360 B2 * 10/2019 Drexel .................... H01J 37/09
(Continued)

FOREIGN PATENT DOCUMENTS

DE 10 2017 220 398 B3 2/2019
DE 11 2016 005 577 B4 9/2021

OTHER PUBLICATIONS

German Office Action, Dated Aug. 5, 2024.
(Continued)

*Primary Examiner* — Nicole M Ippolito
(74) *Attorney, Agent, or Firm* — Westborough IP Group, LLC

(57) ABSTRACT

The "rocking beam" method is used to generate a first image of an object and a second image of the object. A control device sets the size and/or the shape of an opening and/or the position of an aperture unit of the particle beam apparatus, and/or at least one electrostatic and/or magnetic deflection unit of the particle beam apparatus for displacing the scanning region, in such a way that a first irradiation direction of the particle beam in the direction of the location on the surface of the object corresponds to a second irradiation direction of the particle beam in the direction of the location on the surface of the object, wherein the first irradiation direction is ascertained from the first image and wherein the second irradiation direction is ascertained from the second image.

13 Claims, 8 Drawing Sheets

(51) Int. Cl.

| | |
|---|---|
| ***H01J 37/244*** | (2006.01) |
| ***H01J 37/26*** | (2006.01) |
| ***H01J 37/28*** | (2006.01) |

(52) U.S. Cl.
CPC ............ *H01J 37/265* (2013.01); *H01J 37/28* (2013.01); *H01J 2237/1506* (2013.01); *H01J 2237/24475* (2013.01); *H01J 2237/2448* (2013.01); *H01J 2237/24495* (2013.01); *H01J 2237/30488* (2013.01)

(58) Field of Classification Search
CPC ..... H01J 2237/1506; H01J 2237/24475; H01J 2237/2448; H01J 2237/24495; H01J 2237/30488
See application file for complete search history.

(56) References Cited

U.S. PATENT DOCUMENTS

| | | | | |
|---|---|---|---|---|
| 12,288,664 | B2 * | 4/2025 | Preikszas ................ | H01J 37/10 |
| 2013/0320210 | A1 | 12/2013 | Yamada et al. | |
| 2018/0374673 | A1 | 12/2018 | Yabu | |
| 2019/0148104 | A1 | 5/2019 | Preikszas | |
| 2020/0013581 | A1 | 1/2020 | Vystavel et al. | |
| 2020/0152419 | A1 | 5/2020 | Yabu | |

OTHER PUBLICATIONS

L. Han et al., “A new beam alignment method in SEM based on parallax principle”, Microscopy and Microanalysis 27 (2021), pp. 1612-1613.

Ludwig Reimer, *Scanning Electron Microscopy*, 2nd edition, Heidelberg (Germany) 1998, Chapter 9.2.

* cited by examiner

METHOD FOR OPERATING A PARTICLE BEAM APPARATUS, COMPUTER PROGRAM PRODUCT AND PARTICLE BEAM APPARATUS FOR CARRYING OUT THE METHOD

CROSS-REFERENCE TO RELATED APPLICATIONS

This application claims the priority of the German patent application No. 10 2023 131 592.7, filed on Nov. 14, 2023, which is incorporated herein by reference.

TECHNICAL FIELD

This application relates to operating a particle beam apparatus for processing, imaging and/or analysing an object.

BACKGROUND

Electron beam apparatuses, in particular a scanning electron microscope (also referred to as SEM below) and/or a transmission electron microscope (also referred to as TEM below), are used to examine objects (also referred to as samples below) in order to gain insight into the properties and the behaviour under certain conditions.

In an SEM, an electron beam (also referred to as primary electron beam below) is generated using a beam generator and focused on an object to be examined by way of a beam guiding system. The primary electron beam is guided over a surface of the object to be examined using a deflection device in the form of a scanning device. In the process, the electrons of the primary electron beam interact with the object to be examined. As a consequence of the interaction, electrons, in particular, are emitted by the object (so-called secondary electrons), and electrons of the primary electron beam are backscattered (so-called backscattered electrons). The secondary electrons and the backscattered electrons are detected and used for image generation. An image representation of the object to be examined is thus obtained. Furthermore, interaction radiation, for example x-ray radiation or cathodoluminescence, is generated during the interaction, and the radiation is detected using a detector and subsequently evaluated in order to analyse the object.

In the case of a TEM, a primary electron beam is likewise generated using a beam generator and guided on an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged on a luminescent screen or on a detector (for example a camera) by a system consisting of an objective and a projection unit. Here, imaging can also take place in the scanning mode of a TEM. Usually, such a TEM is referred to as STEM. Additionally, the use of a further detector to detect electrons backscattered at the object to be examined and/or secondary electrons emitted by the object to be examined may be provided, in order to image an object to be examined.

Combining the function of a STEM and an SEM in a single particle beam apparatus is known. A resulting particle beam apparatus can thus be used to carry out examinations of objects with an SEM function and/or with a STEM function.

Moreover, a particle beam apparatus with an ion beam column is known. Ions used for processing an object are generated using an ion beam generator arranged in the ion beam column. For example, material of the object is ablated, or material is applied to the object during the processing, for example with a gas being supplied. In addition to that or in an alternative, the ions are used for imaging.

Furthermore, the prior art teaches the use of combination apparatuses for examining objects, in which both electrons and ions can be guided onto an object to be examined. For example, additionally equipping an SEM with an ion beam column is known. An ion beam generator arranged in the ion beam column is used to generate ions that are used for the preparation of an object (for example ablating material of the object or applying material to the object) or else for imaging. For this purpose, the ions are scanned over the object using a deflection device in the form of a scanning device. In such a system, the SEM serves in particular to observe the preparation, but also for further examination of the prepared or unprepared object.

When an image of an object is generated, imaging of an object can be implemented using a particle beam apparatus with a high spatial resolution. In particular, this is achieved by a very small diameter of the primary electron beam in the plane of the object. Furthermore, the spatial resolution may improve the more the electrons of the primary electron beam are initially accelerated in the particle beam apparatus and decelerated to a desired energy (referred to as landing energy) at the end in the objective lens or in the region of the objective lens and the object. For example, the electrons of the primary electron beam are accelerated using an acceleration voltage of 2 kV to 30 kV and guided through an electron beam column of a particle beam apparatus. The electrons of the primary electron beam are only decelerated to the desired landing energy, and land on the object, in the region between the objective lens and the object. For example, the landing energy of the electrons of the primary electron beam lies in the range between 10 eV and 30 keV.

In order to raster-scan a particle beam over an object, it is known to arrange a scanning device on a particle beam apparatus. For example, the scanning device includes a first guide device in the form of a first deflection device and a second guide device in the form of a second deflection device, where the first deflection device and the second deflection device are arranged in succession along the optical axis of the particle beam apparatus. The position of a virtual tilting point of the particle beam along the optical axis of the particle beam apparatus can be displaced by combining the deflections of the particle beam which can be achieved by the first deflection device and the second deflection device, where the deflection appears virtually as generated by a tilt about the tilting point.

The prior art teaches a method which is used to image defects in crystalline materials. The method is known as "Electron Channelling Contrast Imaging" (hereinafter also referred to as ECCI). The known method is based on the effects of electron channelling and electron diffraction, which occur when a primary electron beam is passed through a crystal lattice of an object. The number of electrons backscattered by the object changes depending on the direction of the primary electron beam in relation to the crystal lattice of the object. Defects in the crystal lattice can be determined by recording an image that is generated by the backscattered electrons. To record the image, the primary electron beam is scanned over the object.

ECCI can be combined with a further method known from the prior art known as "rocking beam". In the further known method, provision is made for (i) the primary electron beam to be pivoted over a certain angular range and for (ii) the primary electron beam to be guided to a predeterminable position on the surface of the object. A two-stage guide device is used for this purpose. First, the primary electron beam is steered away from the optical axis of the particle beam apparatus using a first guide device in the form of a first deflection device. Subsequently, the primary electron beam is steered back to the optical axis using a second guide device in the form of a second deflection device. The further known method can also be described as follows. The primary electron beam is guided to a certain position of a scanning region on the surface of the object, where (i) a first guide device for guiding the primary electron beam and (ii) a second guide device for guiding the primary electron beam are used. As viewed from the beam generator in the direction of the object, the first guide device is arranged first, followed by the second guide device. The first guide device steers the primary electron beam away from the optical axis at a first angle to the optical axis. The second guide device steers the primary electron beam back in the direction of the optical axis at a second angle to the optical axis. The first angle and the second angle can be identical. The first angle runs through a first predeterminable value range and the second angle runs through a second predeterminable value range when the primary electron beam is guided to the certain position of the scanning region.

When creating an image of the object, a user of a particle beam apparatus takes care to obtain the optimal image quality of an image of an object required for examining an object. In other words, a user always wishes to create an image of the object with such a high image quality that the user is able to analyse the object to be examined well on account of the image and the image information contained therein. In this context, the image quality can be determined by objective criteria, for example. In particular, the image quality of an image improves with increasing resolution in the image or with increasing contrast. Alternatively, the image quality can be determined on the basis of subjective criteria. In this case, a user determines individually whether or not an obtained image quality is sufficient for them. However, it is quite possible in this case that the image quality deemed sufficient by a first user is not sufficient for a second user. For example, the image quality of an image of an object can also be determined on the basis of the signal-to-noise ratio of the detector signal. The image quality is not sufficiently high in the event of a signal-to-noise ratio ranging from 0 to 5. For example, a signal-to-noise ratio ranging from 20 to 40 is referred to as a good signal-to-noise ratio (and hence also a good and sufficient image quality). The direction of the secondary particle beam (i.e. the particle beam having secondary electrons and/or backscattered electrons) can also be a measure of image quality. This is explained in more detail below. The secondary electrons can be emitted from the object at different solid angles. Further, the backscattered electrons may be backscattered at different solid angles at the object. The direction of the secondary particle beam (i.e. the solid angle in which the secondary particle beam extends) can be influenced by a tilt of the primary electron beam and/or the object with respect to the optical axis of the particle beam apparatus. Firstly, this allows the direction of the secondary particle beam to be chosen in such a way that the secondary particle beam is incident on a desired detector. Secondly, both the number of secondary electrons generated and the number of backscattered electrons can be influenced by way of the aforementioned tilt. For example, if the primary electron beam enters an object in a manner parallel to a crystal lattice of the object, then the number of secondary electrons and/or backscattered electrons reduces. The detection signal becomes weaker. This leads to a reduction in image quality on account of a poor signal-to-noise ratio. The number of secondary electrons and of backscattered electrons can be increased by setting the tilt of the primary electron beam. Using such a setting, it is possible to distinguish between crystals with a first orientation and crystals with a second orientation on the basis of the strength of the detection signal.

A user of a known state-of-the-art particle beam apparatus choses a suitable mode of operation of the particle beam apparatus in order to obtain a good image quality of an image of the object and/or a good representation of the detection signals based on the detected interaction radiation, which are/is generated with a particle beam apparatus. For example, a user may choose a desired landing energy with which charged particles are incident on the object. Following this, the user chooses settings control parameters for controlling functional units of the particle beam apparatus. For example, the control parameters are physical quantities, in particular a control current or a control voltage, but also for example the ratio of physical quantities, in particular an amplification of physical quantities. The values of the physical quantities can be set on at least one control device and control and/or supply the functional units of the particle beam apparatus in such a way that desired physical effects, for example the generation of certain magnetic fields and/or electrostatic fields, are obtained. Examples of control parameters of at least one control device for controlling at least one functional unit of a particle beam apparatus are explained in more detail further below.

In order to obtain a desired quality of a first image of the object or a first representation of data about the object, it is known to control functional units of the particle beam apparatus using first values of control parameters. In order to obtain a desired quality of a second image of the object or a second representation of data about the object, it is known to control functional units of the particle beam apparatus using second values of control parameters. In other words, the functional units of the particle beam apparatus are controlled with different values of the control parameters using the control device in particular, firstly in the generation of a first image of the object or a first representation of data about the object and secondly in the generation of a second image of the object or a second representation of data about the object. For example, the object is arranged at a shorter distance from an objective lens of the particle beam apparatus when generating an image of the object than when generating a representation of data about the object. The distance between the object and the objective lens is also called the working distance. In other words, the object is arranged at a shorter working distance from the objective lens of the particle beam apparatus when generating an image of the object than when generating a representation of data about the object. In addition to that or in an alternative, it is known that a particle beam current of the order of a few nanoamperes is used to generate an image of the object. Then again, it is known that a current of a particle beam of the order of a few microamperes is used when generating a representation of data about the object.

As regards the prior art, reference is made to DE 11 2016 005 577 B4 and US 2020/0013581 A1.

SUMMARY OF THE INVENTION

A particle beam apparatus can be operated in a first mode of operation or in a second mode of operation. For example, the first mode of operation is provided by controlling the functional units of the particle beam apparatus with first values of control parameters using the control device. Furthermore, the second mode of operation is for example provided by controlling the functional units of the particle beam apparatus with second values of the control parameters using the control device. The different modes of operation can lead to the particle beam of the particle beam apparatus being guided to the object along different optical axes. For example, the particle beam is guided along a first beam path in the first mode of operation. Furthermore, the particle beam is guided along a second beam path in the second mode of operation. The first beam path and the second beam path can be different. This may lead to the particle beam being guided to a different location in the first mode of operation than in the second mode of operation. This is often undesirable.

The method according to the system described herein serves to operate a particle beam apparatus for processing, imaging and/or analysing an object. The particle beam apparatus includes at least one beam generator that generates a particle beam with charged particles. In this respect, the particle beam is generated by the beam generator in the method according to the system described herein. For example, the charged particles are electrons or ions. Moreover, the particle beam apparatus for example includes an objective lens for focusing the particle beam on the object.

The method according to the system described herein provides for at least one value of at least one control parameter to be selected in order to control at least one functional unit of the particle beam apparatus using a control device of the particle beam apparatus. A functional unit is understood herein to be any structural unit of the particle beam apparatus which can be set in any way. For example, the position of the functional unit in the particle beam apparatus can be set. In addition to that or in an alternative, provision is made for an electrostatic and/or magnetic embodiment of the functional unit to be set such that the guidance of the particle beam in the particle beam apparatus and/or the shape of the particle beam are/is deliberately influenced. The invention is not restricted to the aforementioned setting options. Rather, the functional unit can be set in any manner suitable for the invention. Furthermore, provision is for example made for the functional unit to be formed as a single functional unit or include a plurality of functional units.

For example, the control parameter is a physical quantity, in particular a control current or a control voltage, but also for example the ratio of physical quantities, in particular an amplification of physical quantities. The values of the physical quantity for example can be set on or using the control unit and control and/or supply the functional unit of the particle beam apparatus in such a way that desired physical effects, for example the generation of specific magnetic fields and/or electrostatic fields, are achieved.

Examples of control parameters are explained in detail below.

A first control parameter serves to set the so-called landing energy of the charged particles of the particle beam on the object. The charged particles have this landing energy when incident on the object. In other words, the landing energy of the charged particles is the energy with which the object is examined and/or imaged. The landing energy of the charged particles may differ from the energy with which the charged particles are guided through a beam column of the particle beam apparatus. In particular, provision is made for the charged particles to be accelerated very strongly at first and only be decelerated to the landing energy just before incidence on the object. This is explained in detail further below. By way of example, the landing energy of the charged particles is in the range from 1 eV to 30 keV, including the range boundaries. A landing energy of 1 keV or less is preferably used in an imaging mode in which an image of the object is generated. A landing energy in the range of 10 keV to 20 keV is preferably used in an analysis mode in which data about the object are generated, for example, using x-ray radiation. However, the invention is not restricted to the aforementioned ranges of the landing energy. Rather, any range suitable for the invention can be used in the invention.

A second control parameter for example serves to control an objective lens of the particle beam apparatus, which is used to set focusing of the particle beam on the object.

A third control parameter serves to centre the particle beam in the objective lens. For example, the control device serves to set electrostatic and/or magnetic units of the particle beam apparatus so that the centring of the particle beam in the objective lens is set.

Moreover, the image quality of an image of the object and/or the quality of the representation of the detection signals based on the detected interaction radiation (i.e. of data about the object) is influenced by a fourth control parameter for controlling and setting electrostatic and/or magnetic deflection units used in the particle beam apparatus for a so-called "beam shift". As a result, it is possible to set the position of a scanning region on the object and optionally displace the scanning region to a desired position. This may be implemented without the use of a sample stage on which the object is arranged. For example, should a change in the settings on the particle beam apparatus lead to the scanning region migrating out of the actual region of the object observed using the particle beam apparatus, the particle beam is displaced in such a way as a result of translational movements in the event of a "beam shift" that the raster-scan region once again lies in the desired observed region.

A stigmator used in the particle beam apparatus may also influence the image quality of the image of the object and/or the quality of the representation of the detection signals based on the detected interaction radiation. The stigmator, a magnetic and/or electrostatic multi-pole element, is used in particular for correcting astigmatism. The stigmator can be set by the control device using a fifth control parameter.

The image quality of an image of the object and/or the quality of the representation of the detection signals based on the detected interaction radiation may however also be influenced by the position of a mechanically displaceable unit of the particle beam apparatus. The position of the mechanically displaceable unit of the particle beam apparatus can be set using a sixth control parameter, for example. For example, the image quality is influenced by the position of an aperture unit used to shape and bound the particle beam in the particle beam apparatus. In an alternative to that or in addition, provision is made for the position of an adjustable sample stage, on which the object is arranged, to be modified. For example, it is then possible to set the distance between the object and the objective lens of the particle beam apparatus. This distance is called working distance. Should the object be imaged using the particle beam apparatus (i.e. in the imaging mode), the working distance is in the range of 1 mm or less than 1 mm for example. Should x-ray spectroscopy be performed, the working distance for example is in the range greater than 1 mm, for example between 2 mm and 10 mm.

The image quality of an image of the object and/or the quality of the representation of the detection signals based on the detected interaction radiation may further be influenced by the so-called scan rotation. This is a rotation of the scanning region in the plane of the raster-scan region about an optical axis of the particle beam apparatus. For example, the scan rotation can be set using a seventh control parameter.

With an eighth control parameter, functional units of the particle beam apparatus can be set such that the current of the particle beam can be set. For example, the functional units are embodied as the objective lens, the aperture unit and/or a condenser lens. To generate an image of the object, a current of the particle beam of the order of a few picoamperes is used. Such a current of the particle beam is preferred in the imaging mode. Then again, a current of the particle beam of the order of a few nanoamperes is used when generating a representation of data about the object. Such a current of the particle beam is preferred in the analysis mode.

With a ninth control parameter, functional units of the particle beam apparatus can be set in such a way that a high vacuum or a pressure corresponding almost to atmospheric pressure is prevalent in a sample chamber of the particle beam apparatus. For example, setting the ninth control parameter controls a pump arranged on the sample chamber. In particular, the sample chamber is operated in a first pressure range or in a second pressure range. The first pressure range includes only pressures less than or equal to $10^{-3}$ hPa, and the second pressure range includes only pressures greater than $10^{-3}$ hPa. The sample chamber is vacuum-sealed in order to ensure these pressure ranges. If it is determined that, firstly, the sample chamber is operated in the first pressure range and that, secondly, the object is charged on account of the particle beam being guided to the object, then the ninth control parameter is modified in such a way that the sample chamber is operated in the second pressure range. In the second pressure range, a gas with ions, for example, is then guided to the object such that the charge of the object on the surface of the object is neutralized. For example, the object is charged when the image of the object is unstable, especially when the brightness and/or the contrast of the image of the object change/changes during multiple scans across the same region of the object. For example, the object is also charged if the same features are still visible after a scan rotation has changed the direction of a scan in the image and/or if the position of the object in the image changes. In addition to that or in an alternative, a charge of the object is identified, for example, by comparing the image of the object with a further image of the object from a database, the further image showing the object with charges.

The method according to the system described herein provides for the functional unit to be controlled with the value of the control parameter using the control device. The control causes the particle beam to be guided along a first beam path of the particle beam apparatus from the beam generator in the direction of the object. Accordingly, the particle beam apparatus is operated in a first mode of operation when the functional unit is controlled by the value of the control parameter.

Furthermore, the method according to the system described herein includes guiding the particle beam to a predeterminable location of a scanning region on the surface of the object using a first guide device provided for guiding the particle beam and a second guide device provided for guiding the particle beam. As viewed from the beam generator in the direction of the object, the first guide device is arranged on and/or in the particle beam apparatus first, followed by the second guide device. For example, the first guide device is embodied as a first deflection device. The first deflection device is embodied as an electrostatic and/or magnetic deflection device in particular. Further, for example, the second guide device is embodied as a second deflection device. The second deflection device is embodied as an electrostatic and/or magnetic deflection device in particular. The method according to the system described herein provides for the first guide device to guide the particle beam away from an optical axis of the particle beam apparatus at a first angle to the optical axis. In this case, the optical axis is understood to mean an axis, for example of an objective lens of the particle beam apparatus, along which particles of the particle beam run when not experiencing a deflection (focusing) from fields, for example of the objective lens of the particle beam apparatus. Furthermore, the method according to the system described herein provides for the second guide device to guide the particle beam in the direction of the optical axis at a second angle with respect to the optical axis. When guiding the particle beam to the predeterminable location, the first angle runs through a first predeterminable value range and the second angle runs through a second predeterminable value range. In other words, the method known as "rocking beam" is performed at the predeterminable location.

The method according to the system described herein furthermore provides for first interaction particles and/or a first interaction radiation to be detected by at least one detector. The first interaction particles and/or the first interaction radiation result/results from an interaction of the particle beam with the object when the particle beam is incident on the object. First detection signals are generated using the detected first interaction particles and/or the detected first interaction radiation. Further, a first image of the object is generated using the first detection signals using the control device.

Moreover, the method according to the system described herein provides for at least one value of at least one further control parameter for controlling the functional unit of the particle beam apparatus to be selected using the control device. For example, the further control parameter is a physical quantity, in particular a control current or a control voltage, but also for example the ratio of physical quantities, in particular an amplification of physical quantities. The values of the physical quantity for example can be set on or using the control unit and control and/or supply the functional unit of the particle beam apparatus in such a way that desired physical effects, for example the generation of specific magnetic fields and/or electrostatic fields, are achieved. With regard to the further control parameter, reference is made to the explanations relating to the examples of the control parameter further above, which also apply here.

The method according to the system described herein provides for the functional unit to be controlled with the value of the further control parameter using the control device. This control causes the particle beam to be guided along a second beam path of the particle beam apparatus from the beam generator in the direction of the object. Accordingly, the particle beam apparatus is operated in a second mode of operation when the functional unit is controlled by the value of the further control parameter. Due to different control of the functional unit in the first mode of operation and in the second mode of operation, the first beam path and the second beam path can differ. In other words, the course of the particle beam in the particle beam apparatus in the first mode of operation differs from the course of the particle beam in the second mode of operation.

Moreover, the method according to the system described herein provides for the particle beam to be guided to the predeterminable location of the scanning region on the surface of the object using the first guide device and the second guide device. The first guide device guides the particle beam away from the optical axis at a third angle with respect to the optical axis. Furthermore, the method according to the system described herein provides for the second guide device to guide the particle beam in the direction of the optical axis at a fourth angle with respect to the optical axis. When guiding the particle beam to the predeterminable location, the third angle runs through a third predeterminable value range and the fourth angle runs through a fourth predeterminable value range. In other words, the method known as "rocking beam" is performed at the predeterminable location.

The method according to the system described herein furthermore provides for second interaction particles and/or a second interaction radiation to be detected by the detector. The second interaction particles and/or the second interaction radiation result/results from an interaction of the particle beam with the object when the particle beam is incident on the object. Second detection signals are generated using the detected second interaction particles and/or the detected second interaction radiation. Further, a second image of the object is generated using the second detection signals using the control device.

In the method according to the system described herein, the control device is now used to set (i) a size, shape and/or position of an opening of an aperture unit of the particle beam apparatus and/or (ii) at least one electrostatic and/or magnetic deflection unit of the particle beam apparatus. When setting the aperture unit and/or the deflection unit, the scanning region is displaced in such a way that a first irradiation direction of the particle beam in the direction of the location on the surface of the object corresponds to a second irradiation direction of the particle beam in the direction of the location on the surface of the object, where the first irradiation direction is ascertained from the first image and where the second irradiation direction is ascertained from the second image. In principle, the irradiation direction is the direction from which the particle beam is incident on the location on the surface of the object. For example, the first irradiation direction is aligned tilted at a first irradiation angle with respect to the optical axis. Furthermore, the second irradiation direction in particular is aligned tilted at a second irradiation angle with respect to the optical axis. For example, the deflection unit can be embodied as the first guide device, as the second guide device and/or as a further guide device. For example, the first image is compared with the second image in order to ascertain the first irradiation direction and the second irradiation direction, where, for example, the first image and the second image are superimposed. For example, Kikuchi lines recognizable in the two images are brought into alignment with one another. In addition to that or in an alternative, provision is made for the use of a Hough transform to align lines ascertained in both images. In addition to that or in an alternative, provision is made for deviations of the first image and the second image to be determined using an image recognition system. The aforementioned setting, for example the superimposition of the first image and the second image, is implemented until the deviations are no longer present or present only to a small extent. Then the first irradiation direction corresponds to the second irradiation direction.

The system described herein recognizes that application of the method, referred to as "rocking beam", in different modes of operation of the particle beam apparatus allows the different beam paths caused by the different modes of operation of the particle beam apparatus to be aligned with each other or be mergeable. The system described herein ensures that, in the different modes of operation, the particle beam firstly is guided to the same location on the object and secondly has the same orientation with respect to the object, so that the same lattice plane of a crystal lattice of the object is measured in a crystalline object.

One embodiment of the method according to the system described herein additionally or alternatively provides for the control parameter and the further control parameter to be identical. This embodiment of the method according to the system described herein then additionally or alternatively includes the control parameter being used as the further control parameter. In particular, provision is made here for the value of the control parameter to be a first value and for the value of the further control parameter to be a second value.

A further embodiment of the method according to the system described herein additionally or alternatively provides for the first angle to be used as the second angle. In other words, the first angle and the second angle are identical. Accordingly, when controlling the functional unit with the value of the control parameter, the particle beam (i) is guided away from the optical axis at the first angle to the optical axis by the first guide device, and (ii) is subsequently guided back in the direction of the optical axis at the first angle to the optical axis by the second guide device. Yet a further embodiment of the method according to the system described herein additionally or alternatively provides for the third angle to be used as the fourth angle. In other words, the third angle and the fourth angle are identical. Accordingly, when controlling the functional unit with the value of the further control parameter, the particle beam (i) is guided away from the optical axis at the third angle to the optical axis by the first guide device, and (ii) is subsequently guided back in the direction of the optical axis at the third angle to the optical axis by the second guide device.

One embodiment of the method according to the system described herein additionally or alternatively provides for at least one of the following method steps: (i) using the first predeterminable value range with angles from the range between 0° and 90°; (ii) using the second predeterminable value range with angles from the range between 0° and 90°; (iii) using the third predeterminable value range with angles from the range between 0° and 90°; and (iv) using the fourth predeterminable value range with angles from the range between 0° and 90°. Explicit reference is made to the fact that the invention is not restricted to the aforementioned angles. Rather, any angle suitable for the invention can be used.

A further embodiment of the method according to the system described herein additionally or alternatively provides for at least one of the following method steps: (i) using the first predeterminable value range as the second predeterminable value range; and (ii) using the third predeterminable value range as the fourth predeterminable value range. In other words, for example, the first predeterminable value range and the second predeterminable value range are identical. Furthermore, for example, the third predeterminable value range and the fourth predeterminable value range are identical.

As explained above, a functional unit is understood herein to be any structural unit of the particle beam apparatus which can be set in any way. For example, the position of the functional unit in the particle beam apparatus can be set. In addition to that or in an alternative, provision is made for an electrostatic and/or magnetic embodiment of the functional unit to be set such that the guidance of the particle beam in the particle beam apparatus and/or the shape of the particle beam is deliberately influenced. One embodiment of the method according to the system described herein additionally or alternatively provides for the use of at least one specific functional unit for the method according to the system described herein. For example, the method according to the system described herein includes at least one of the following method steps: (i) using the beam generator as the functional unit in order to set a particle current supplied to the object; (ii) using the aperture unit as the functional unit in order to set a convergence angle of the particle beam; (iii) using a first condenser lens of the particle beam apparatus as the functional unit; and (iv) using a second condenser lens of the particle beam apparatus as the functional unit. Explicit reference is made to the fact that the invention is not restricted to the use of the aforementioned functional units of the particle beam apparatus. Rather, any functional unit of the particle beam apparatus suitable for the invention can be used in the invention.

A further embodiment of the method according to the system described herein additionally or alternatively provides for at least one of the following method steps to be carried out: (i) detecting backscatter particles as first interaction particles; (ii) detecting backscatter particles as second interaction particles; (iii) detecting backscattered electrons as first interaction particles; and (iv) detecting backscattered electrons as second interaction particles. In this case, backscatter particles are understood to mean particles backscattered from the object, and backscattered electrons are understood to mean electrons backscattered from the object. It has been found that the detection of backscatter particles, in particular backscattered electrons, is particularly readily suitable for the method known as “rocking beam” and/or for ECCI. However, explicit reference is made to the fact that the invention is not restricted to the detection of backscatter particles, in particular backscattered electrons. Rather, any interaction particles and/or interaction radiation suitable for the invention can be detected in the invention.

All the embodiments of the method according to the system described herein are not restricted to the mentioned sequence of the method steps. It is possible to use different sequences of the method steps which are suitable for solving the problem within the meaning of the invention. In an alternative to that or in addition, the method according to the system described herein also provides for the parallel implementation of at least two of the method steps mentioned herein. Furthermore, the embodiments of the method according to the system described herein are not restricted to the complete scope of all the method steps mentioned herein. In particular, provision is made for individual or a plurality of the method steps herein to be omitted in further embodiments.

The system described herein also relates to a computer program product that includes program code which is loadable or is loaded into a processor of a particle beam apparatus, where the program code, when executed in the processor, controls the particle beam apparatus in such a way that a method having at least one of the aforementioned or following features or having a combination of at least two of the aforementioned or following features is carried out. In other words, the system described herein also relates to a non-transitory, computer-readable medium that includes software which is loadable or is loaded into a processor of a particle beam apparatus, where the software, when executed in the processor, controls the particle beam apparatus in such a way that a method having at least one of the aforementioned or following features or having a combination of at least two of the aforementioned or following features is carried out. The software includes executable code for carrying out at least one of the method steps herein.

In this respect, the system described herein also relates to a processor arranged on a particle beam apparatus and configured to carry out a method having at least one of the aforementioned or following features or having a combination of at least two of the aforementioned or following features.

The system described herein further relates to a particle beam apparatus for processing, imaging and/or analysing an object, where the particle beam apparatus that is explained above is specified in detail further below. This is, once again, briefly summarized below.

The particle beam apparatus according to the system described herein includes at least one beam generator that generates a particle beam with charged particles. The charged particles are electrons or ions, for example. Furthermore, the particle beam apparatus according to the system described herein is provided with at least one aperture unit that sets the particle beam. For example, the shape and/or the current of the particle beam is set with the aperture unit. In particular, the size of an opening of the aperture unit and/or the position of the aperture unit in the particle beam apparatus can be set. Furthermore, the particle beam apparatus according to the system described herein includes at least one functional unit for generating, setting, guiding and/or shaping the particle beam. As explained above, a functional unit is understood to be any structural unit of the particle beam apparatus which can be set in any way. For example, the position of the functional unit in the particle beam apparatus can be set. In addition to that or in an alternative, provision is made for an electrostatic and/or magnetic embodiment of the functional unit to be set such that the guidance of the particle beam in the particle beam apparatus and/or the shape of the particle beam is deliberately influenced.

Moreover, the particle beam apparatus according to the system described herein includes at least one first guide device that guides the particle beam. For example, the first guide device is embodied as a first deflection device. The first deflection device is embodied as an electrostatic and/or magnetic deflection device in particular. Further, the particle beam apparatus according to the system described herein includes at least one second guide device for guiding the particle beam. For example, the second guide device is embodied as a second deflection device. The second deflection device is embodied as an electrostatic and/or magnetic deflection device in particular. For example, the first guide device and/or the second guide device is/are embodied as the functional unit.

Furthermore, the particle beam apparatus according to the system described herein includes at least one detector that detects interaction particles and/or interaction radiation, where the interaction particles and/or the interaction radiation result/results from an interaction of the particle beam with the object when the particle beam is incident on the object.

The particle beam apparatus according to the system described herein also includes at least one electrostatic and/or magnetic deflection unit. For example, the electrostatic and/or magnetic deflection unit includes a condenser lens or a plurality of condenser lenses, for example two condenser lenses or three condenser lenses.

Moreover, the particle beam apparatus according to the system described herein includes at least one control device having a processor in which a computer program product with the features mentioned further above is loaded.

One embodiment of the particle beam apparatus according to the system described herein additionally or alternatively provides for the particle beam apparatus to include at least one scanning device for raster-scanning the particle beam over the object. The scanning device is provided with the first guide device and the second guide device.

Yet a further embodiment of the particle beam apparatus according to the system described herein additionally or alternatively provides for the particle beam apparatus to include at least one objective lens for focusing the particle beam on the object. For example, the first guide device and/or the second guide device is/are arranged within the objective lens of the particle beam apparatus. In particular provision is made for the first guide device and/or the second guide device to be arranged within the objective lens along an optical axis of the particle beam apparatus.

One embodiment of the particle beam apparatus according to the system described herein additionally or alternatively provides for the beam generator to be embodied as a first beam generator and for the particle beam to be embodied as a first particle beam with first charged particles. The objective lens is embodied as a first objective lens for focusing the first particle beam on the object. Moreover, the particle beam apparatus according to the system described herein includes at least one second beam generator for generating a second particle beam with second charged particles. Further, the particle beam apparatus according to the system described herein includes at least one second objective lens for focusing the second particle beam on the object.

In particular, provision is made for the particle beam apparatus according to the system described herein to be embodied as an electron beam apparatus and/or as an ion beam apparatus.

BRIEF DESCRIPTION OF DRAWINGS

Further practical embodiments and advantages of the system described herein are described below in conjunction with the drawings, in which.

DETAILED DESCRIPTION OF VARIOUS EMBODIMENTS

The system described herein will now be explained in more detail with particle beam apparatuses in the form of an SEM and in the form of a combination apparatus having an electron beam column and an ion beam column. Explicit reference is made to the fact that the invention can be used for any particle beam apparatus, in particular for any electron beam apparatus and/or any ion beam apparatus.

Figure 1:
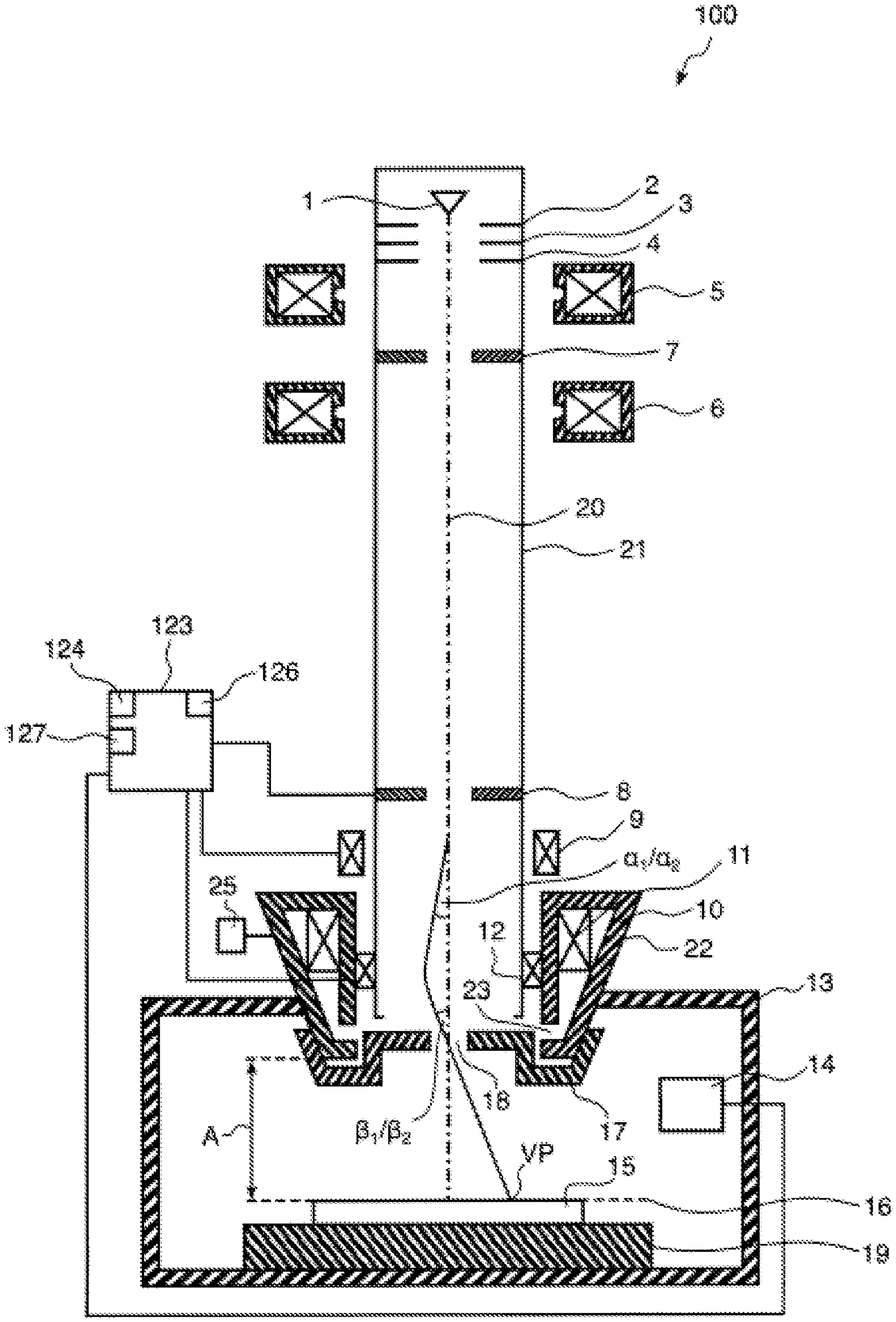
FIG. 1 shows a schematic illustration of a first embodiment of a particle beam apparatus according to the system described herein.

FIG. 1 shows a schematic illustration of an embodiment of a particle beam apparatus according to the system described herein in the form of an SEM 100. The SEM 100 includes a beam generator 1 having an electron source, an extraction electrode 2, a control electrode 3 and an anode 4. The anode 4 forms a source-side end of a beam guiding tube 21 of the SEM 100. The beam generator 1 is embodied as a thermal field emitter, for example. In an alternative, the beam generator 1 is embodied as a thermal tungsten emitter or as a $LAB_6$ emitter, for example.

Electrons that emerge from the beam generator 1 form a primary electron beam. The electrons are accelerated to anode potential due to a potential difference between the beam generator 1 and the anode 4. The potential of the anode 4 for example is 1 kV to 30 KV positive in comparison with the potential of the beam generator 1, and so the electrons have a kinetic energy in the range between 1 keV and 30 keV.

As viewed in the direction of an objective lens 10 along an optical axis 20 starting from the anode 4, the SEM 100 includes a first condenser lens 5 first, followed by a second condenser lens 6. An aperture unit 7 is arranged in the beam guiding tube 21 between the first condenser lens 5 and the second condenser lens 6. In the SEM 100 shown in FIG. 1, the objective lens 10 is embodied as a magnetic lens and includes a pole piece 22 with a pole piece gap 23. A ring coil 11 for generating the magnetic field of the objective lens 10 is arranged in the pole piece 22.

As explained further above, the beam path of the particle beam depends on the mode of operation of the SEM 100. This is explained in detail further below.

As viewed in the direction of the objective lens 10 starting from the second condenser lens 6, a guide system having a first guide device in the form of a first deflection device 9 and having a second guide device in the form of a second deflection device 12 is arranged along the optical axis 20 of the SEM 100. The first deflection device 9 is arranged source side on the objective lens 10. By contrast, the second deflection device 12 is arranged on the beam guiding tube 21 object side within the objective lens 10. The first deflection device 9 and the second deflection device 12 are crossed beam deflection devices. In other words, both the first deflection device 9 and the second deflection device 12 are embodied in such a way that the deflection devices 9, 12 deflect the primary electron beam in two directions which are not parallel to each other and are aligned at right angles to the direction of the optical axis 20. For example, the first deflection device 9 and/or the second deflection device 12 is/are embodied as a magnetic deflection device(s). In particular, the first deflection device 9 and/or the second deflection device 12 accordingly each include/includes, for example, four air coils that are arranged around the optical axis 20 of the SEM 100. In addition to that or in an alternative, provision is made for the first deflection device 9 and/or the second deflection device 12 to be embodied as an electrostatic deflection device(s). In particular, the first deflection device 9 and/or the second deflection device 12 accordingly each include/includes, for example, four electrodes which are arranged around the optical axis 20 of the SEM 100 and to which different electrostatic potentials can be applied.

The objective lens 10 is arranged on a sample chamber 13. In particular, the objective lens 10 protrudes through an opening of the sample chamber 13 into an interior of the sample chamber 13. A movable object stage 19 is arranged in the interior of the sample chamber 13. An object 15 can be arranged on the object stage 19.

Using the objective lens 10, the primary electron beam generated by the beam generator 1 and shaped using the first condenser lens 5 and/or the second condenser lens 6 is focused in an object plane 16. Suitable excitations of the first deflection device 9 and the second deflection device 12 ensure that the primary electron beam is deflectable perpendicular to the optical axis 20 of the SEM 100 in the object plane 16 such that the surface of the object 15 arranged in the object plane 16 can be raster-scanned by different deflections of the primary electron beam. In the process, the electrons of the primary electron beam interact with the object 15. As a consequence of the interaction, electrons in particular are emitted by the object 15 (so-called secondary electrons), and electrons of the primary electron beam are backscattered (so-called backscattered electrons). The secondary electrons and the backscattered electrons are detected and used for image generation. An image representation of the object 15 to be examined is thus obtained. Furthermore, interaction radiation, for example x-ray radiation or cathodoluminescence, is generated during the interaction, and the interaction radiation is detected and subsequently evaluated in order to analyse the object 15.

For the detection of the aforementioned interaction particles and/or aforementioned interaction radiation, a first detector unit 14 is for example arranged in the sample chamber 13. In addition to that or in an alternative, a second detector unit 8 for detecting the aforementioned interaction particles is for example arranged in the beam guiding tube 21 in the region between the first deflection device 9 and the second condenser lens 6.

For example, in the embodiment of the SEM 100 shown in FIG. 1, a pressure stage aperture mount 17 is provided, which can be arranged on the pole piece 22 of the objective lens 10 projecting into the sample chamber 13. For example, the pressure stage aperture mount 17 includes a pressure stage aperture unit having an aperture 18. Further pressure stage aperture units can be arranged, for example, within the beam guiding tube 21 of the SEM 100. These are not shown in FIG. 1. FIG. 1 does not show vacuum pumps either, the latter being desired, for example, for generating and maintaining the desired vacuum within the beam guiding tube 21 and the sample chamber 13 for the operation of the SEM 100.

For example, the pressure stage aperture mount 17 is not mandatory if the SEM 100 is intended to be operated under high vacuum in the sample chamber 13, and so the pressure stage aperture mount 17 can therefore be removed from the pole piece 22 of the objective lens 10. Then again, if the SEM 100 is for example intended to be operated at relatively high pressure in the sample chamber 13 (pressures in the range of about 1 to 3000 Pa), then the pressure stage aperture mount 17 should be mounted on the pole piece 22 of the objective lens 10 such that a sufficiently good vacuum can be maintained within the beam guiding tube 21 by differential pumping, despite the higher pressure in the sample chamber 13. In the event of a mounted pressure stage aperture mount 17, the edge of the aperture 18 within the pressure stage aperture mount 17 for example leads to a trimming of the image field which can be raster-scanned in the object plane 16.

In particular, the first detector unit 14, the second detector unit 8, the first deflection device 9 and the second deflection device 12 are connected to a control device 123, which includes a monitor 124. The control device 123 processes detection signals generated by the first detector unit 14 and the second detector unit 8 and displays the signals in the form of images on the monitor 124. The control device 123 also includes a database 126, in which data are stored and from which data are read out. Moreover, the control device 123 is connected to further units of the SEM 100. This is not illustrated in detail in FIG. 1.

The control device 123 of the SEM 100 includes a processor 127. A computer program product having a program code which, when executed, carries out a method for operating the SEM 100 is loaded in the processor 127. This is explained in detail further below.

In the SEM 100, it is possible to set a distance A using the control device 123 of the SEM 100. The distance A is given either (a) by an object distance between an outer boundary of the objective lens 10 of the SEM 100 and the object 15 or (b) by a focal plane distance between the outer boundary of the objective lens 10 of the SEM 100 and a focal plane of the objective lens 10. The aforementioned distance A according to case (a) or case (b) is also referred to as working distance. For example, the distance A in case (a) is set by moving the object stage 19 and/or moving the objective lens 10 using a movement device 25. In particular, the distance A in case (b) is set by varying an excitation of the objective lens 10 along the optical axis 20 of the SEM 100.

Figure 2:
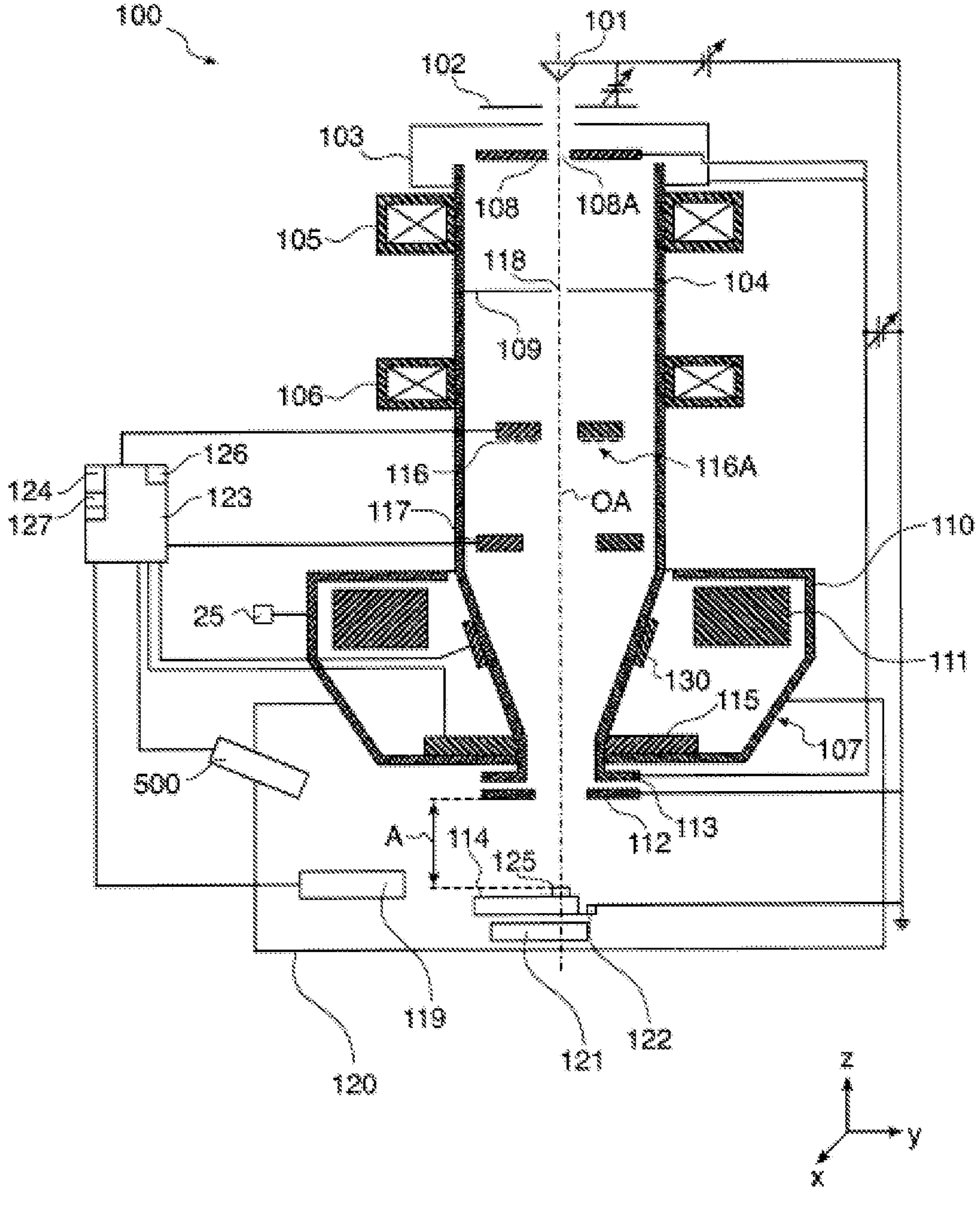
FIG. 2 shows a schematic illustration of a second embodiment of a particle beam apparatus according to the system described herein.

FIG. 2 shows a schematic illustration of a further SEM 100. The further SEM 100 includes a first beam generator in the form of an electron source 101, which is embodied as a cathode. Furthermore, the further SEM 100 is provided with an extraction electrode 102 and with an anode 103, which is placed onto one end of a beam guiding tube 104 of the further SEM 100. For example, the electron source 101 is embodied as a thermal field emitter. However, the invention is not restricted to such an electron source 101. Rather, any electron source suitable for the invention can be used.

Electrons emerging from the electron source 101 form a primary electron beam. The electrons are accelerated to anode potential owing to a potential difference between the electron source 101 and the anode 103. In the embodiment shown in FIG. 2, the anode potential is 100 V to 35 kV, for example 5 kV to 15 kV, in particular 8 kV, relative to a ground potential of a housing of a sample chamber 120. However, the anode potential could alternatively also be at ground potential.

Two condenser lenses, specifically a first condenser lens 105 and a second condenser lens 106, are arranged on the beam guiding tube 104. As viewed in the direction of a first objective lens 107 starting from the electron source 101, the first condenser lens 105 is arranged first in this case, followed by the second condenser lens 106. Explicit reference is made to the fact that further embodiments of the further SEM 100 may include only a single condenser lens. A first aperture unit 108 is arranged between the anode 103 and the first condenser lens 105. Together with the anode 103 and the beam guiding tube 104, the first aperture unit 108 is at a high-voltage potential, specifically the potential of the anode 103, or connected to ground. The first aperture unit 108 includes numerous first apertures 108A, one of which is depicted in FIG. 2. For example, two first apertures 108A are present. Each one of the numerous first apertures 108A has a different aperture diameter. Using an adjusting mechanism (not shown), it is possible to set a desired first aperture 108A onto an optical axis OA of the further SEM 100. Explicit reference is made to the fact that, in further embodiments, the first aperture unit 108 can be provided only with a single first aperture 108A and therefore, an adjusting mechanism cannot be provided. The first aperture unit 108 is then embodied to be stationary. A stationary second aperture unit 109 is arranged between the first condenser lens 105 and the second condenser lens 106. In an alternative, provision is made for the second aperture unit 109 to be movable.

As explained further above, the beam path of the particle beam depends on the mode of operation of the further SEM 100. This is explained in detail further below.

The first objective lens 107 includes pole pieces 110, in which a drilled hole is formed. The beam guiding tube 104 is guided through the drilled hole. A coil 111 is arranged in the pole pieces 110.

An electrostatic retardation device is arranged in a lower region of the beam guiding tube 104. The electrostatic retardation device includes a single electrode 112 and a tube electrode 113. The tube electrode 113 is arranged at an end of the beam guiding tube 104 that faces an object 125 arranged on a movable object holder 114.

Together with the beam guiding tube 104, the tube electrode 113 is at the potential of the anode 103, while the single electrode 112 and the object 125 are at a lower potential in relation to the potential of the anode 103. In the present case, the lower potential is the ground potential of the housing of the sample chamber 120. In this way, the electrons of the primary electron beam can be decelerated to a desired energy which is desired for examining the object 125.

The object 125 and the single electrode 112 can also be at different potentials and potentials that differ from ground. This makes it possible to set the location of the retardation of the primary electron beam in relation to the object 125. For example, imaging aberrations become smaller if the retardation is carried out quite close to the object 125.

The further SEM 100 furthermore includes a guide system having a first guide device in the form of a first deflection device 130 and having a second guide device in the form of a second deflection device 115. The first deflection device 130 is arranged source side within the first objective lens 107. By contrast, the second deflection device 115 is arranged on the beam guiding tube 104 object side within the first objective lens 107. The first deflection device 130 and the second deflection device 115 are crossed beam deflection devices. In other words, both the first deflection device 130 and the second deflection device 115 are embodied in such a way that the deflection devices 130, 115 deflect the primary electron beam in two directions which are not parallel to each other and are aligned at right angles to the direction of the optical axis OA of the further SEM 100. For example, the first deflection device 130 and/or the second deflection device 115 is/are embodied as a magnetic deflection device(s). In particular, the first deflection device 130 and/or the second deflection device 115 accordingly each include/includes, for example, four air coils that are arranged around the optical axis OA of the further SEM 100. In addition to that or in an alternative, provision is made for the first deflection device 130 and/or the second deflection device 115 to be embodied as an electrostatic deflection device(s). In particular, the first deflection device 130 and/or the second deflection device 115 accordingly each include/includes, for example, four electrodes which are arranged around the optical axis OA of the SEM 100 and to which different electrostatic potentials can be applied. Using the first deflection device 130 and the second deflection device 115, the primary electron beam is deflected and can be scanned (or raster-scanned) over the object 125. In the process, the electrons of the primary electron beam interact with the object 125. The interaction gives rise to interaction particles, which are detected. In particular, electrons emitted from the surface of the object 125—so-called secondary electrons—or electrons of the primary electron beam backscattered—so-called backscattered electrons—are interaction particles.

A detector arrangement that includes a first detector 116 and a second detector 117 is arranged in the beam guiding tube 104 for the purpose of detecting the secondary electrons and/or the backscattered electrons. In this case, the first detector 116 is arranged source side along the optical axis OA, while the second detector 117 is arranged object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and the beam guiding tube 104. The optical axis OA of the SEM 100 runs through the respective passage openings.

The second detector 117 serves mainly for detection of secondary electrons. Upon emergence from the object 125, the secondary electrons initially have a low kinetic energy and random directions of motion. The secondary electrons are accelerated in the direction of the first objective lens 107 using the strong extraction field emanating from the tube electrode 113. The secondary electrons enter the first objective lens 107 approximately in parallel. The beam diameter of the beam of the secondary electrons remains small even in the first objective lens 107. The first objective lens 107 then has a strong effect on the secondary electrons and generates a comparatively short focus of the secondary electrons with sufficiently steep angles to the optical axis OA, and so the secondary electrons diverge significantly from one another downstream of the focus and are incident on the active area of the second detector 117. By contrast, only a small proportion of electrons backscattered at the object 125—i.e. backscattered electrons with a relatively high kinetic energy in comparison with the secondary electrons upon emergence from the object 125—are detected by the second detector 117. The high kinetic energy and the angles of the backscattered electrons to the optical axis OA upon emergence from the object 125 have the effect that a beam waist, i.e., a beam region of minimal diameter, of the backscattered electrons lies in the vicinity of the second detector 117. A large portion of the backscattered electrons passes through the through opening of the second detector 117. Therefore, the first detector 116 substantially serves to detect the backscattered electrons.

In a further embodiment of the further SEM 100, the first detector 116 can be designed to also have an opposing field grid 116A. The opposing field grid 116A is arranged on the side of the first detector 116 directed toward the object 125. With respect to the potential of the beam guiding tube 104, the opposing field grid 116A has a negative potential such that only backscattered electrons with a high kinetic energy pass through the opposing field grid 116A to the first detector 116. In addition to that or in an alternative, the second detector 117 includes a further opposing field grid, which has an analogous design to the aforementioned opposing field grid 116A of the first detector 116 and has an analogous function.

Further, in the sample chamber 120 the further SEM 100 includes a chamber detector 119, for example an Everhart-Thornley detector or an ion detector, which has a metal-coated detection surface that blocks light.

The detection signals generated by the first detector 116, the second detector 117 and the chamber detector 119 are used to generate an image or images of the surface of the object 125.

Explicit reference is made to the fact that both the apertures of the first aperture unit 108 and of the second aperture unit 109 and the passage openings in the first detector 116 and in the second detector 117 are depicted in exaggerated fashion. The passage openings in the first detector 116 and in the second detector 117 have an extent perpendicular to the optical axis OA in the range of 0.5 mm to 5 mm. For example, the passage openings are of circular design and have a diameter in the range of 1 mm to 3 mm perpendicular to the optical axis OA.

The second aperture unit 109 is configured as a pinhole aperture unit in the embodiment illustrated in FIG. 2 and is provided with a second aperture 118 for the passage of the primary electron beam, which has an extent in the range of 5 μm to 500 μm, for example 35 μm. In an alternative, provision is for example made in a further embodiment for the second aperture unit 109 to be provided with a plurality of apertures that are able to be mechanically shifted to the primary electron beam or able to be reached by the primary electron beam using electrical and/or magnetic deflection elements. For example, the second aperture unit 109 is designed as a pressure stage aperture unit. In one embodiment, the second aperture unit 109 separates a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region in this exemplary embodiment is the intermediate pressure region of the beam guiding tube 104, which leads to the sample chamber 120.

For example, the sample chamber 120 can be under or near atmospheric pressure or is under vacuum in a further embodiment. To generate the vacuum, a pump (not depicted) in particular is arranged on the sample chamber 120. For example, in the embodiment shown in FIG. 2, the sample chamber 120 is operated in a first pressure range or in a second pressure range. In particular, provision is made for the first pressure range to include only pressures of less than or equal to $10^{-3}$ hPa and for the second pressure range to include only pressures of greater than $10^{-3}$ hPa. To ensure these pressure ranges, the sample chamber 120 is for example vacuum-sealed.

The object holder 114 is arranged on an object stage 122. The object stage 122 is designed to be movable in three directions arranged perpendicular to one another, specifically in an x-direction (first stage axis), in a y-direction (second stage axis) and in a z-direction (third stage axis). Moreover, the object stage 122 can be rotated about two axes of rotation (axes of rotation of the stage) which are arranged perpendicular to one another. The invention is not restricted to the aforementioned object stage 122. Rather, the object stage 122 may have a different number of translational movement axes and axes of rotation, along which or about which the object stage 122 can move. For example, a further axis is aligned in the z-direction, along which or with which a eucentric height can be set.

The further SEM 100 also includes a third detector 121 arranged in the sample chamber 120. More precisely, the third detector 121 is arranged downstream of the object stage 122, as viewed from the electron source 101 along the optical axis OA. The object stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

Arranged on the sample chamber 120 is a radiation detector 500, which is used to detect interaction radiation, for example x-ray radiation and/or cathodoluminescence, generated when the primary electron beam is incident on the object 125. The radiation detector 500, the first detector 116, the second detector 117 and the chamber detector 119 are connected to a control device 123, which includes a monitor 124. The third detector 121 is also connected to the control device 123. This is not shown for reasons of clarity. The control device 123 processes detection signals that are generated by the first detector 116, the second detector 117, the chamber detector 119, the third detector 121 and/or the radiation detector 500 and displays said detection signals in the form of images on the monitor 124.

The control device 123 also includes a database 126, in which data are stored and from which data are read out. Further, the control device 123 is connected to the guide system, which includes the first deflection device 130 and the second deflection device 115. Moreover, the control device 123 is connected to further units of the further SEM 100. This is not shown in detail for reasons of clarity.

The control device 123 of the further SEM 100 includes a processor 127. A computer program product having a program code which, when executed, carries out a method for operating the further SEM 100 is loaded in the processor 127. This is explained in detail further below.

In the further SEM 100, it is possible to set a distance A using the control device 123 of the further SEM 100. The distance A is given either (a) by an object distance between an outer boundary of the first objective lens 107 of the further SEM 100 (e.g. the single electrode 112) and the object 125 or (b) by a focal plane distance between the outer boundary of the first objective lens 107 of the further SEM 100 and a focal plane of the first objective lens 107. The aforementioned distance A according to case (a) or case (b) is also referred to as working distance. For example, the distance A in case (a) is set by moving the object stage 122 and/or moving the first objective lens 107 using a movement device 25. For example, the distance A in case (b) is set by varying an excitation of the first objective lens 107 along the optical axis OA of the further SEM 100.

Figure 2A:
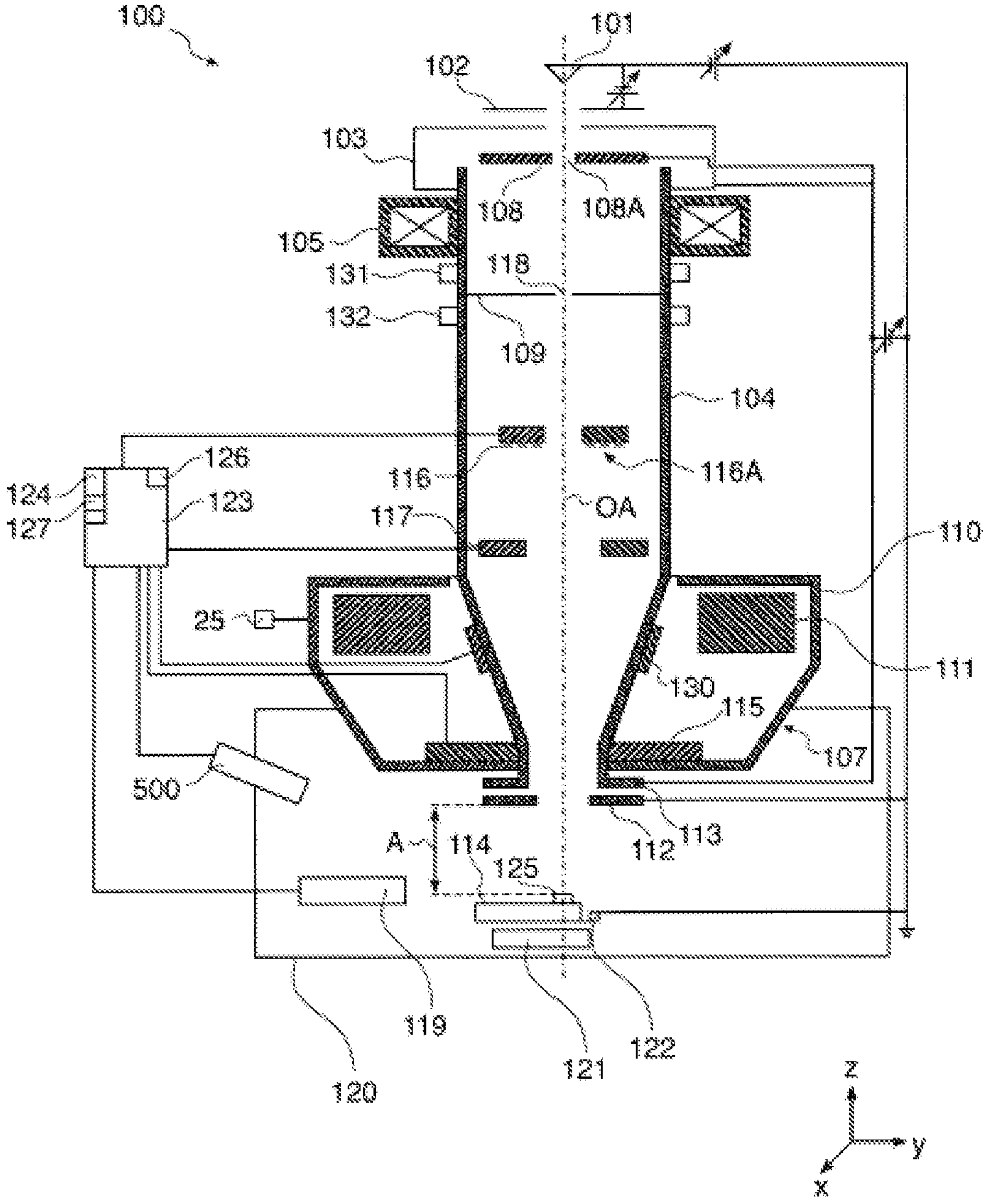
FIG. 2A shows a schematic illustration of a third embodiment of a particle beam apparatus according to the system described herein.

FIG. 2A shows a further embodiment of a yet further SEM 100, which is based on the embodiment of the further SEM 100 as shown in FIG. 2. Therefore, reference is made to the explanations given above, which also apply here. In contrast to the embodiment as shown in FIG. 2, the embodiment as shown in FIG. 2A does not include a second condenser lens 106. Rather, a first deflection unit 131 is arranged source side on the second aperture unit 109 and a second deflection unit 132 is arranged object side on the second aperture unit 109. For example, the first deflection unit 131 and/or the second deflection unit 132 is/are embodied as an electrostatic and/or magnetic deflection unit(s).

Figure 3:
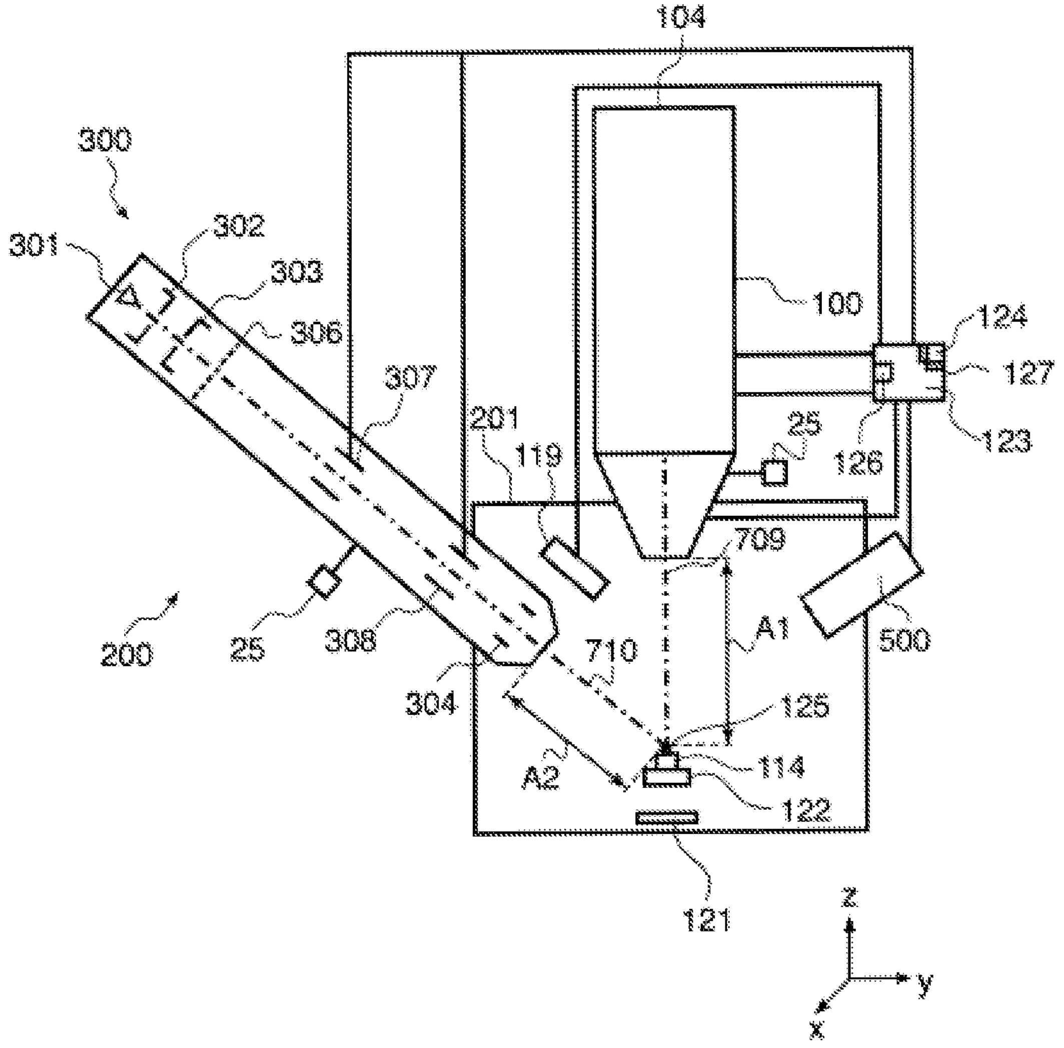
FIG. 3 shows a schematic illustration of a fourth embodiment of a particle beam apparatus according to the system described herein.

FIG. 3 shows a particle beam apparatus in the form of a combination apparatus 200. The combination apparatus 200 includes two particle beam columns. Firstly, the combination apparatus 200 is provided with the further SEM 100, as shown in FIG. 2, albeit without the sample chamber 120. Rather, the further SEM 100 is arranged on a sample chamber 201. The sample chamber 201 is under vacuum. To generate the vacuum, a pump (not shown) is arranged on the sample chamber 201. For example, in the embodiment shown in FIG. 3, the sample chamber 201 is operated in a first pressure range or in a second pressure range. For example, the first pressure range includes only pressures of less than or equal to $10^{-3}$ hPa, and the second pressure range includes only pressures of greater than $10^{-3}$ hPa. To ensure these pressure ranges, the sample chamber 201 is for example vacuum-sealed.

Arranged in the sample chamber 201 is the chamber detector 119 which for example is embodied in the form of an Everhart-Thornley detector or in the form of an ion detector and has a metal-coated detection surface that blocks light. Further, the third detector 121 is arranged in the sample chamber 201.

The further SEM 100 serves to generate a first particle beam, specifically the primary electron beam described above, and includes the optical axis mentioned above, which is provided with the reference sign 709 in FIG. 3 and is also referred to as first beam axis below. Secondly, the combination apparatus 200 is provided with an ion beam apparatus 300 likewise arranged on the sample chamber 201. The ion beam apparatus 300 likewise has an optical axis, which is provided with the reference sign 710 in FIG. 3 and is also referred to as second beam axis below.

As explained above, the beam path of the primary electron beam along the first beam axis 709 and/or the beam path of a second particle beam (an ion beam) along the second beam axis 710 are/is dependent on the mode of operation of the combination apparatus 200. This is explained in detail further below.

The further SEM 100 is arranged vertically in relation to the sample chamber 201. By contrast, the ion beam apparatus 300 is arranged in a manner inclined at an angle of approx. 0° to 90° to the further SEM 100. For example, an arrangement at approx. 50° is shown in FIG. 3. The ion beam apparatus 300 includes a second beam generator in the form of an ion beam generator 301. Ions, which form a second particle beam in the form of an ion beam, are generated by the ion beam generator 301. The ions are accelerated using an extraction electrode 302 at a predeterminable potential. The second particle beam then passes through an ion optical unit of the ion beam apparatus 300, the ion optical unit having a condenser lens 303 and a second objective lens 304. The second objective lens 304 ultimately generates an ion probe, which is focused on the object 125 arranged on an object holder 114. The object holder 114 is arranged on an object stage 122.

A settable or selectable aperture unit 306 is arranged above the second objective lens 304 (i.e. in the direction of the ion beam generator 301). Furthermore, provision is made for a guide system having a first guide device in the form of a first deflection device 307 and a second guide device in the form of a second deflection device 308. The first deflection device 307 is arranged source side, for example within the second objective lens 304. By contrast, the second deflection device 308 is arranged object side, for example within the second objective lens 304. The first deflection device 307 and the second deflection device 308 are crossed beam deflection devices. In other words, both the first deflection device 307 and the second deflection device 308 are embodied in such a way that the deflection devices 307, 308 deflect the ion beam in two directions which are not parallel to each other and are aligned at right angles to the direction of the optical axis in the form of the second beam axis 710 of the ion beam apparatus 300. For example, the first deflection device 307 and/or the second deflection device 308 is/are embodied as a magnetic deflection device(s). In particular, the first deflection device 307 and/or the second deflection device 308 accordingly each include/includes, for example, four air coils that are arranged around the optical axis in the form of the second beam axis 710 of the ion beam apparatus 300. In addition to that or in an alternative, provision is made for the first deflection device 307 and/or the second deflection device 308 to be embodied as electrostatic deflection device(s). In particular, the first deflection device 307 and/or the second deflection device 308 accordingly each include/includes, for example, four electrodes which are arranged around the optical axis in the form of the second beam axis 710 of the ion beam apparatus 300 and to which different electrostatic potentials can be applied. Using the first deflection device 307 and the second deflection device 308, the ion beam is deflected and can be scanned (or raster-scanned) over the object 125.

As explained above, the object holder 114 is arranged on the object stage 122. In the embodiment shown in FIG. 3, too, the object stage 122 is designed to be movable in three directions arranged perpendicular to one another, specifically in an x-direction (first stage axis), in a y-direction (second stage axis) and in a z-direction (third stage axis). Moreover, the object stage 122 can be rotated about two axes of rotation (axes of rotation of the stage) which are arranged perpendicular to one another.

The distances depicted in FIG. 3 between the individual units of the combination apparatus 200 are presented in exaggerated fashion in order to better illustrate the individual units of the combination apparatus 200.

A radiation detector 500 used to detect interaction radiation, for example x-ray radiation and/or cathodoluminescence, is arranged on the sample chamber 201. The radiation detector 500 is connected to a control device 123, which includes a monitor 124.

The control device 123 processes detection signals that are generated by the first detector 116 (not shown in FIG. 3), the second detector 117 (not shown in FIG. 3), the chamber detector 119, the third detector 121 and/or the radiation detector 500 and displays the detection signals in the form of images on the monitor 124.

The control device 123 also includes a database 126, in which data are stored and from which data are read out.

Further, the control device 123 is connected to the guide system which includes the first deflection device 130 (not shown in FIG. 3) and the second deflection device 115 (not shown in FIG. 3) for the primary electron beam of the further SEM 100 and to the guide system which includes the first deflection device 307 and the second deflection device 308 for the ion beam of the ion beam apparatus 300.

The control device 123 of the combination apparatus 200 has a processor 127. A computer program product includes a program code which, when executed, carries out a method for operating the combination apparatus 200 is loaded in the processor 127. This is explained in detail further below.

It is also possible in the combination apparatus 200 to set working distances. It is possible in the further SEM 100, for example, to set a distance A1 using the control device 123. The distance A1 is given either (a) by an object distance between an outer boundary of the first objective lens 107 of the further SEM 100 and the object 125 or (b) by a focal plane distance between the outer boundary of the first objective lens 107 of the further SEM 100 and a focal plane of the first objective lens 107. The aforementioned distance A1 according to case (a) or case (b) is also referred to as working distance. For example, the distance A1 in case (a) is set by moving the object stage 122 and/or moving the first objective lens 107 using the movement device 25. For example, the distance A1 in case (b) is set by varying an excitation of the first objective lens 107 along the first beam axis 709 of the further SEM 100. It is further possible to set a distance A2 using the control device 123. The distance A2 is given either (a) by an object distance between an outer boundary of the second objective lens 304 of the ion beam apparatus 300 and the object 125 or (b) by a focal plane distance between the outer boundary of the second objective lens 304 of the ion beam apparatus 300 and a focal plane of the second objective lens 304. The aforementioned distance A2 according to case (a) or case (b) is also referred to as working distance. For example, the distance A2 in case (a) is set by moving the object stage 122 and/or moving the second objective lens 304 using a movement device 25. For example, the distance A2 in case (b) is set by varying an excitation of the second objective lens 304 along the second beam axis 710 of the ion beam apparatus 300.

Figure 4:
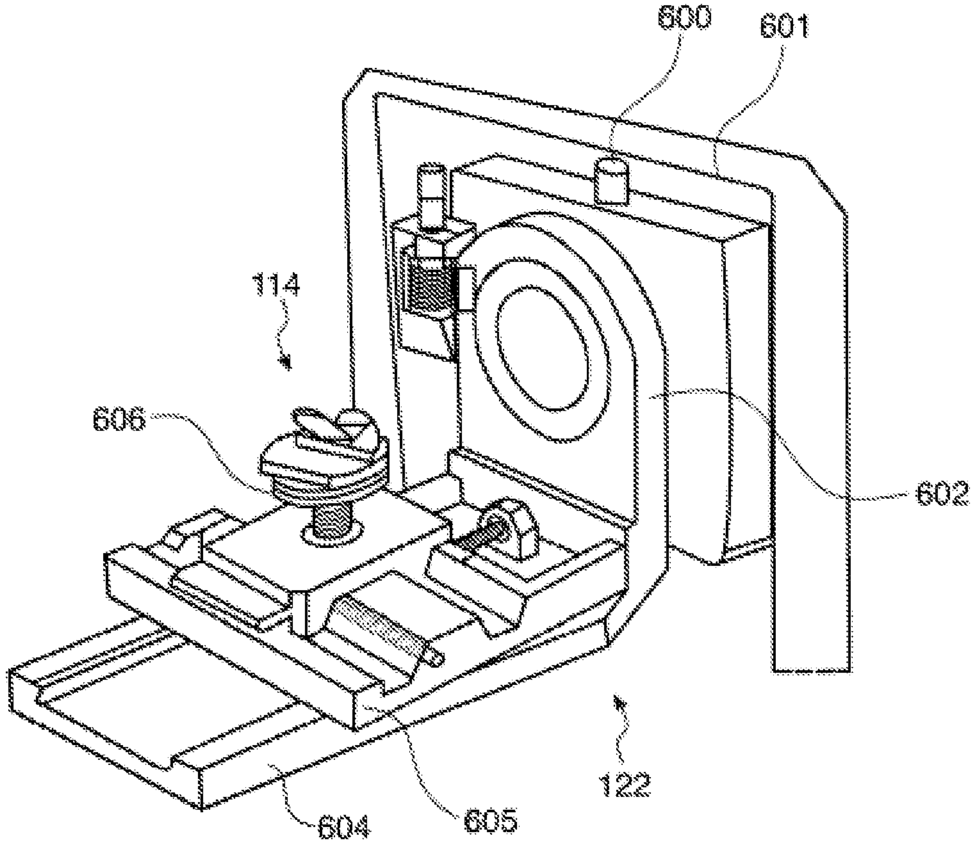
FIG. 4 shows a schematic illustration of an embodiment of a movable object stage according to the system described herein.

Hereinbelow, the object stage 122 of the further SEM 100 as shown in FIG. 2, the yet further SEM 100 as shown in FIG. 2A and the combination apparatus 200 as shown in FIG. 3 are discussed in detail. The object stage 122 is designed as a movable object stage, which is depicted schematically in FIGS. 4 and 5. The same applies correspondingly to the object stage 19 of the SEM 100 as shown in FIG. 1.

Reference is made to the fact that the invention is not restricted to the object stage 122 described here. Rather, the invention can include any movable object stage suitable for the invention.

The object holder 114 is arranged on the object stage 122. The object stage 122 includes movement elements that ensure a movement of the object stage 122 in such a way that a region of interest on the object 125 can be examined, for example using a particle beam. The movement elements are depicted schematically in FIGS. 4 and 5 and are explained below.

The object stage 122 includes a first movement element 600 for example arranged on a housing 601 of the sample chamber 120 or 201, in which the object stage 122 is arranged in turn. The first movement element 600 enables a movement of the object stage 122 along the z-axis (third stage axis). A second movement element 602 is also provided. The second movement element 602 enables a rotation of the object stage 122 about a first axis of rotation 603 of the stage, which is also referred to as a tilt axis. This second movement element 602 serves to tilt the object 125 about the first axis of rotation 603 of the stage, where the object 125 is arranged on the object holder 114.

In turn, a third movement element 604, which is designed as a guide for a slide and ensures that the object stage 122 is movable in the x-direction (first stage axis), is arranged on the second movement element 602. The aforementioned slide is in turn a further movement element, specifically a fourth movement element 605. The fourth movement element 605 is designed such that the object stage 122 is movable in the y-direction (second stage axis). For this purpose, the fourth movement element 605 includes a guide in which a further slide is guided, the object holder 114 in turn being arranged on the latter. The object holder 114 is in turn designed with a fifth movement element 606, which enables a rotation of the object holder 114 about a second axis of rotation 607 of the stage. The second axis of rotation 607 of the stage is oriented perpendicularly to the first axis of rotation 603 of the stage.

On account of the above-described arrangement, the object stage 122 of the embodiment discussed here has the following kinematic chain: first movement element 600 (movement along the z-axis)—second movement element 602 (rotation about the first axis of rotation 603 of the stage)—third movement element 604 (movement along the x-axis)—fourth movement element 605 (movement along the y-axis)—fifth movement element 606 (rotation about the second axis of rotation 607 of the stage).

In a further embodiment (not shown), provision is made for further movement elements to be arranged on the object stage 122 such that movements along further translational axes and/or about further rotation axes are made possible.

Figure 5:
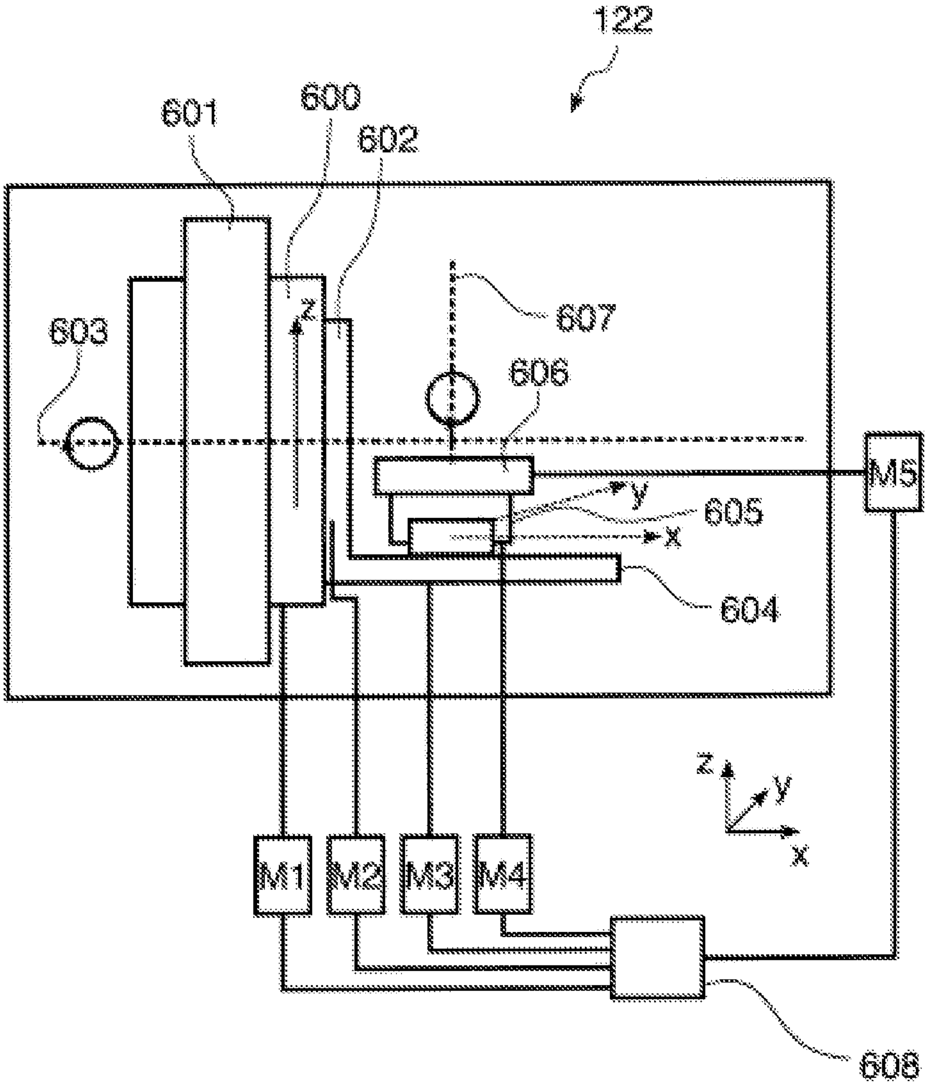
FIG. 5 shows a further schematic illustration of the embodiment of the movable object stage as shown in FIG. 4.

As is evident from FIG. 5, each of the aforementioned movement elements is connected to a drive unit in the form of a motor M1 to M5. In this regard, the first movement element 600 is connected to a first drive unit M1 and is driven owing to a driving force that is provided by the first drive unit M1. The second movement element 602 is connected to a second drive unit M2, which drives the second movement element 602. The third movement element 604 is connected in turn to a third drive unit M3. The third drive unit M3 provides a driving force for driving the third movement element 604. The fourth movement element 605 is connected to a fourth drive unit M4, with the fourth drive unit M4 driving the fourth movement element 605. Further, the fifth movement element 606 is connected to a fifth drive unit M5. The fifth drive unit M5 provides a driving force that drives the fifth movement element 606.

The aforementioned drive units M1 to M5 can be designed as stepper motors, for example, and are controlled by a drive control unit 608 and are each supplied with a supply current by the drive control unit 608 (cf. FIG. 5). Explicit reference is made to the fact that the invention is not restricted to the movement using stepper motors. Rather, any drive units suitable for the invention can be used as drive units, for example brushless motors.

Embodiments of the method according to the system described herein are explained in detail hereinbelow in relation to the SEM 100 as shown in FIG. 1. Corresponding statements apply in relation to the SEM 100 as shown in FIG. 2, the SEM 100 as shown in FIG. 2A and the combination apparatus 200 as shown in FIG. 3.

Figure 6:
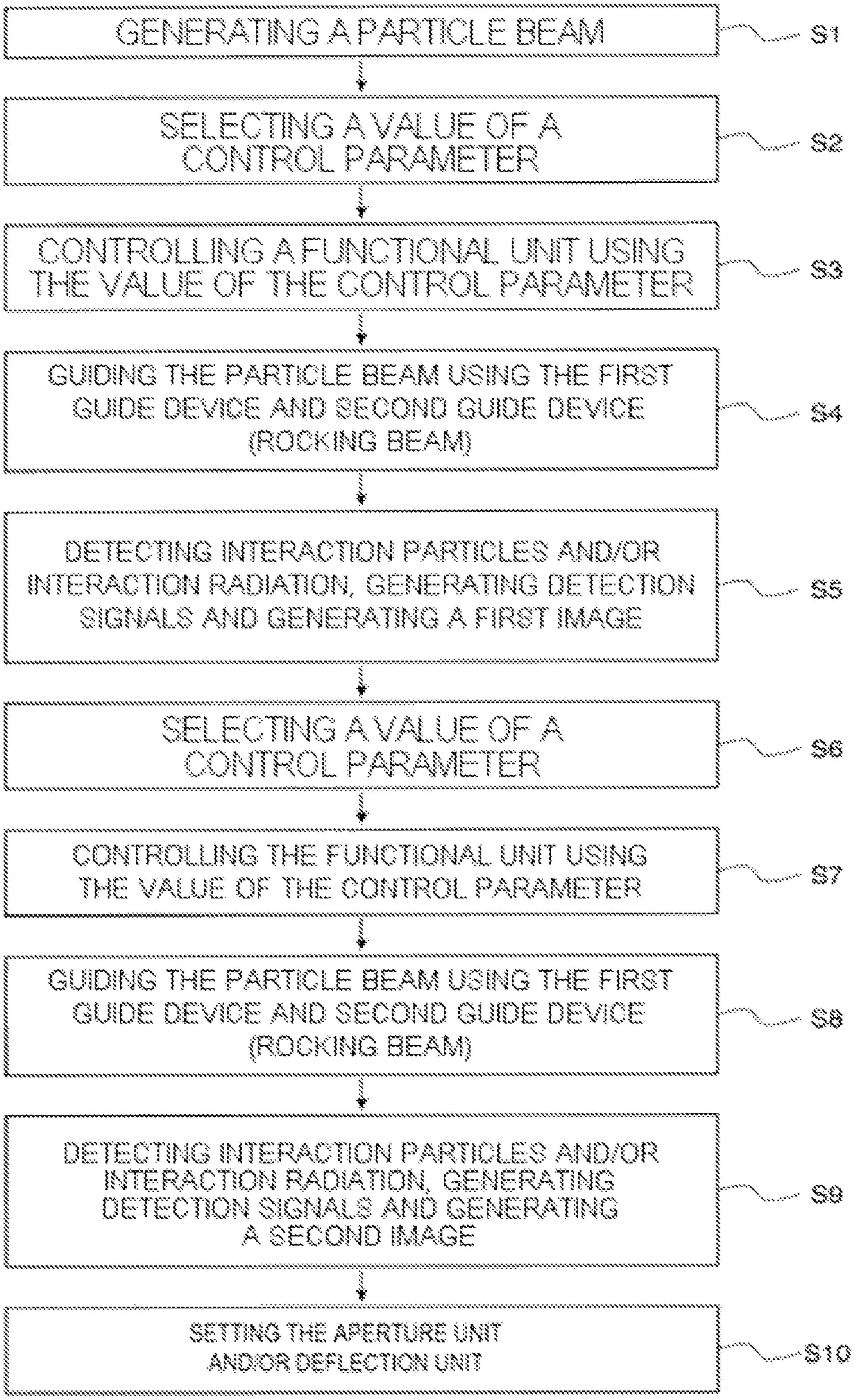
FIG. 6 shows a schematic illustration of an operation sequence of a first embodiment of the method according to the system described herein.

FIG. 6 shows one embodiment of the method according to the system described herein carried out by the SEM 100 as shown in FIG. 1. In method step S1, the particle beam in the form of the primary electron beam is generated using the beam generator 1.

Moreover, method step S2 provides for at least one value of a control parameter for controlling at least one functional unit of the SEM 100 to be selected using the control device 123. For example, the control parameter is a physical quantity, in particular a control current or a control voltage, but also for example a ratio of physical quantities, in particular an amplification of physical quantities. The values of the physical quantity for example can be set on or using the control device 123 and control and/or supply the functional unit of the SEM 100 in such a way that desired physical effects, for example the generation of specific magnetic fields and/or electrostatic fields, are achieved. Examples of the control parameter are explained further above. Reference is made to the above explanations for the control parameter examples, which also apply here.

In particular, in the embodiment of the method according to FIG. 6, a functional unit is understood to be a structural unit of the SEM 100 which can be set in any way. For example, the position of the functional unit in the SEM 100 can be set. In addition to that or in an alternative, provision is made for an electrostatic and/or magnetic embodiment of the functional unit to be set such that the guidance of the primary electron beam in the SEM 100 and/or the shape of the primary electron beam is deliberately influenced. The invention is not restricted to the aforementioned setting options. Rather, the functional unit can be set in any manner suitable for the invention. Furthermore, provision is for example made for the functional unit to be formed as a single functional unit or include a plurality of functional units. For example, the SEM 100 includes the following structural units, which can be used/are used as a functional unit in the method according to the system described herein: the beam generator 1, the extraction electrode 2, the control electrode 3, the anode 4, the first condenser lens 5, the second condenser lens 6 (if present), the aperture unit 7, the first deflection device 9, the objective lens 10, the second deflection device 12 and/or the object stage 19.

In the method according to the system as shown in FIG. 6, provision is now made in method step S3 for the functional unit, a plurality of the functional units or all functional units to be controlled with the value of the control parameter using the control device 123. This control causes the primary electron beam to be guided along a first beam path of the SEM 100 from the beam generator 1 in the direction of the object 15. Actuating the functional unit, the plurality of functional units or all functional units with the value of the control parameter in essence sets a first mode of operation of the SEM 100. In this first mode of operation of the SEM 100, the primary electron beam runs along the first beam path.

The primary electron beam is now guided to a predeterminable location of a scanning region on the surface of the object 15 in method step S4 using the first deflection device 9 and the second deflection device 12. In particular, provision is made for the first deflection device 9 to guide the primary electron beam away from the optical axis 20 at a first angle $\alpha_1$ with respect to the optical axis 20. Furthermore, provision is made for the second deflection device 12 to guide the primary electron beam in the direction of the optical axis 20 at a second angle 1 with respect to the optical axis 20 (cf. FIG. 1). When guiding the primary electron beam to the predeterminable location at the predeterminable position VP, the first angle $\alpha_1$ runs through a first predeterminable value range and the second angle $\beta_1$ runs through a second predeterminable value range, while the primary electron beam remains at the predeterminable location. In other words, the method known as "rocking beam" is performed at the predeterminable location.

For example, in a further embodiment of the method according to the system described herein, the first angle $\alpha_1$ is used as the second angle $\beta_1$. In other words, the first angle $\alpha_1$ and the second angle $\beta_1$ are identical. Accordingly, when controlling the functional unit, the plurality of functional units or all functional units with the value of the control parameter, the primary electron beam (i) is guided away from the optical axis 20 at the first angle $\alpha_1$ to the optical axis 20 by the first deflection device 9, and (ii) is subsequently guided back in the direction of the optical axis 20 at the first angle $\alpha_1$ to the optical axis 20 by the second deflection device 12. For example, a value range with angles from the range between 0° and 90° is used as the first predeterminable value range. Furthermore, a value range with angles from the range between 0° and 90°, for example, is used as the second predeterminable value range. Explicit reference is made to the fact that the invention is not restricted to the aforementioned angles. Rather, any angle suitable for the invention can be used. A further embodiment of the method according to the system described herein provides for the first predeterminable value range to be used as the second predeterminable value range. In other words, for example, the first predeterminable value range and the second predeterminable value range are identical.

In a method step S5 of the method according to the system described herein, provision is made for first interaction particles and/or a first interaction radiation to be detected using the first detector unit 14 and/or the second detector unit 8. For example, secondary particles, in particular secondary electrons or secondary ions, and/or backscatter particles, in particular electrons backscattered from the object 15 (backscattered electrons), are detected using the first detector unit 14 and/or the second detector unit 8. For example, x-ray radiation and/or cathodoluminescence is detected as first interaction radiation. The first interaction particles and/or the first interaction radiation result/results from an interaction of the primary electron beam with the object 15 when the primary electron beam is incident on the object 15. First detection signals are generated using the detected first interaction particles and/or the detected first interaction radiation. Further, a first image of the object 15 is generated using the first detection signals using the control device 123.

Method step S6 provides for at least one value of a further control parameter for controlling at least one functional unit of the SEM 100 to be selected using the control device 123. For example, the further control parameter is also a physical quantity, in particular a control current or a control voltage, but also for example the ratio of physical quantities, in particular an amplification of physical quantities. The values of the physical quantity for example can be set on or using the control device 123 and control and/or supply the functional unit of the SEM 100 in such a way that desired physical effects, for example the generation of specific magnetic fields and/or electrostatic fields, are achieved. Examples of the control parameter are explained further above. Reference is made to the above explanations for the control parameter examples, which also apply here. One embodiment of the method according to the system described herein provides for the control parameter and the further control parameter to be identical. Hence, the value of the control parameter is a first value and the value of the further control parameter is a second value.

The functional unit to be controlled by the further control parameter is also understood to be a structural unit of the SEM 100 which can be set in any way. For example, the position of the functional unit in the SEM 100 can be set. In addition to that or in an alternative, provision is made for an electrostatic and/or magnetic embodiment of the functional unit to be set such that the guidance of the primary electron beam in the SEM 100 and/or the shape of the primary electron beam is deliberately influenced. The invention is not restricted to the aforementioned setting options. Rather, the functional unit can be set in any manner suitable for the invention. Furthermore, provision is for example made for the functional unit to be formed as a single functional unit or include a plurality of functional units. In particular, provision is made for the functional unit to be controlled with the control parameter and the functional unit to be controlled with the further control parameter to be identical or different. For example, for the method according to the system described herein, the following structural units of the SEM 100 can be used as a functional unit to be controlled with the further control parameter or are used as functional units: the beam generator 1, the extraction electrode 2, the control electrode 3, the anode 4, the first condenser lens 5, the second condenser lens 6 (if present), the aperture unit 7, the first deflection device 9, the objective lens 10, the second deflection device 12 and/or the object stage 19.

In method step S7, provision is made for one of the aforementioned functional units, a plurality of the functional units or all functional units to be controlled with the value of the further control parameter using the control device 123. This control causes the primary electron beam to be guided along a second beam path of the SEM 100 from the beam generator 1 in the direction of the object 15. Actuating the functional unit, the plurality of functional units or all functional units with the value of the further control parameter in essence sets a second mode of operation of the SEM 100. In the second mode of operation of the SEM 100, the primary electron beam runs along the second beam path.

The primary electron beam is now guided to the predeterminable location of a scanning region on the surface of the object 15 in method step S8 using the first deflection device 9 and the second deflection device 12. In particular, provision is made for the first deflection device 9 to guide the primary electron beam away from the optical axis 20 at a third angle $\alpha_2$ with respect to the optical axis 20. Furthermore, provision is made for the second deflection device 12 to guide the primary electron beam in the direction of the optical axis 20 at a fourth angle $\beta_2$ with respect to the optical axis 20. When guiding the primary electron beam to the predeterminable location, the third angle $\alpha_2$ runs through a third predeterminable value range and the fourth angle $\beta_2$ runs through a fourth predeterminable value range, while the primary electron beam remains at the predeterminable location at the predeterminable position VP (cf. FIG. 1). In other words, the method known as "rocking beam" is performed at the predeterminable location. For example, in a further embodiment of the method according to the system described herein, the third angle $\alpha_2$ is used as the fourth angle $\beta_2$. In other words, the third angle $\alpha_2$ and the fourth angle $\beta_2$ are identical. Accordingly, when controlling the functional unit, the plurality of functional units or all functional units with the value of the further control parameter, the primary electron beam (i) is guided away from the optical axis 20 at the third angle $\alpha_2$ to the optical axis 20 by the first deflection device 9, and (ii) is subsequently guided back in the direction of the optical axis 20 at the third angle $\alpha_2$ to the optical axis 20 by the second deflection device 12. For example, a value range with angles from the range between 0° and 90° is used as the third predeterminable value range. Furthermore, a value range with angles from the range between 0° and 90°, for example, is used as the fourth predeterminable value range. Explicit reference is made to the fact that the invention is not restricted to the aforementioned angles. Rather, any angle suitable for the invention can be used. A further embodiment of the method according to the system described herein provides for the third predeterminable value range to be used as the fourth predeterminable value range. In other words, for example, the third predeterminable value range and the fourth predeterminable value range are identical.

In a method step S9 of the method according to the system described herein, provision is made for second interaction particles and/or a second interaction radiation to be detected using the first detector unit 14 and/or the second detector unit 8. For example, secondary particles, in particular secondary electrons or secondary ions, and/or backscatter particles, in particular electrons backscattered from the object 15 (backscattered electrons), are detected using the first detector unit 14 and/or the second detector unit 8. For example, x-ray radiation and/or cathodoluminescence is detected as second interaction radiation. The second interaction particles and/or the second interaction radiation result/results from an interaction of the primary electron beam with the object 15 when the primary electron beam is incident on the object 15. Second detection signals are generated using the detected second interaction particles and/or the detected second interaction radiation. Further, a second image of the object 15 is generated using the second detection signals using the control device 123.

In a method step S10, the control device 123 is now used to set a size, a shape and/or a position of an opening of the aperture unit 7 of the SEM 100. For example, the method step S10 sets the beam current of the primary electron beam and/or a convergence angle of the primary electron beam to the optical axis 20. In addition to that or in an alternative, provision is made for at least one electrostatic and/or magnetic deflection unit of the SEM 100 to be set. The deflection unit is for example embodied as the first deflection device 9 and/or as the second deflection device 12. However, the invention is not restricted to the aforementioned deflection unit. Rather, any electrostatic and/or magnetic deflection unit of the SEM 100 suitable for deflecting the primary electron beam can be used as a deflection unit. When setting the aperture unit 7 and/or the deflection unit, the scanning region is displaced in such a way that a first irradiation direction of the particle beam in the form of the primary electron beam in the direction of the predeterminable position VP on the surface of the object 15 corresponds to a second irradiation direction of the particle beam in the form of the primary electron beam in the direction of the predeterminable position VP on the surface of the object 15, where the first irradiation direction is ascertained from the first image and where the second irradiation direction is ascertained from the second image. In the embodiment as shown FIG. 2A, for example, the first deflection unit 131 and/or the second deflection unit 132 are/is adjusted until the first irradiation direction corresponds to the second irradiation direction. For example, the first image is compared with the second image in order to ascertain the first irradiation direction and the second irradiation direction, where, for example, the first image and the second image are superimposed. For example, Kikuchi lines recognizable in the two images are brought into alignment with one another. In addition to that or in an alternative, provision is made for the use of a Hough transform to align lines ascertained in both images. In addition to that or in an alternative, provision is made for deviations of the first image and the second image to be determined using an image recognition system. The aforementioned setting, for example the superimposition of the first image and the second image, is implemented until the deviations are no longer present or present only to a small extent. Then the first irradiation direction corresponds to the second irradiation direction.

Figure 7:
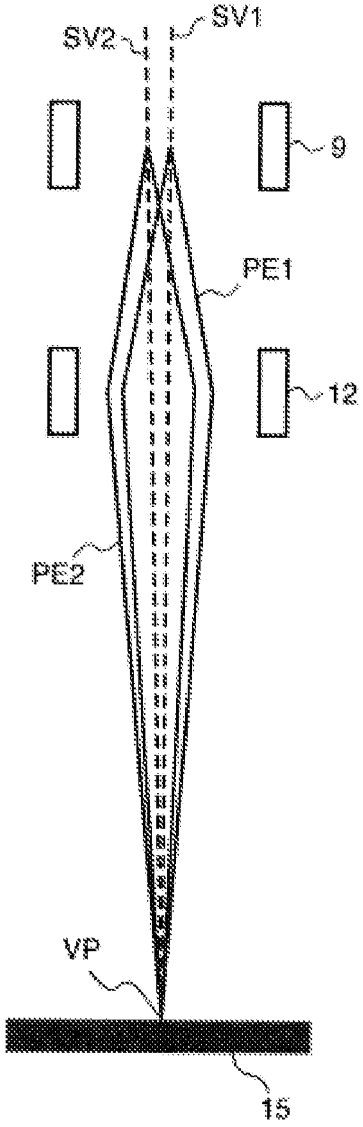
FIG. 7 shows a first schematic illustration of a course of a particle beam in different modes of operation of a particle beam apparatus according to the system described herein.

Method step S10 is explained in greater detail with reference to FIGS. 7 and 8. In the embodiment as shown in FIG. 7, the size, the shape and/or the position of the opening of the aperture unit 7 of the SEM 100 is/are set in such a way that the first irradiation direction corresponds to the second irradiation direction. Then, the first beam path SV1 shown in FIG. 7, along which the primary electron beam PE1 runs in the first mode of operation of the SEM 100, and the second beam path SV2 shown in FIG. 7, along which the primary electron beam PE2 runs in the second mode of operation of the SEM 100, are incident on the surface of the object 15 at the same position, specifically the predeterminable position VP.

Figure 8:
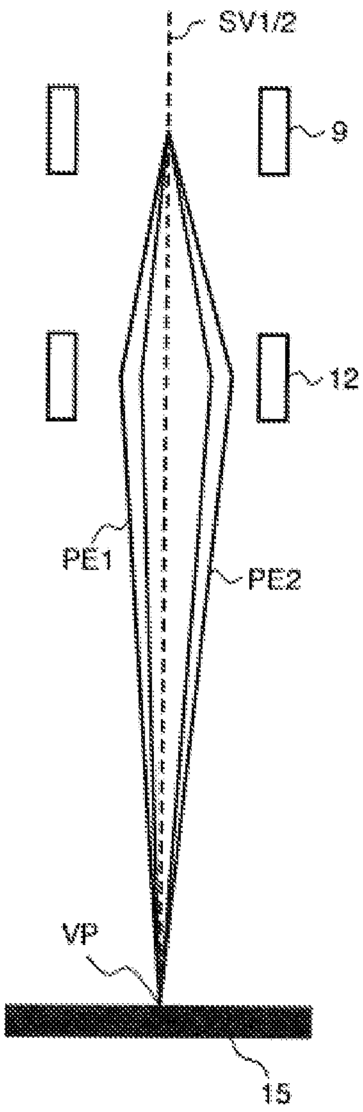
FIG. 8 shows a second schematic illustration of a course of a particle beam in different modes of operation of a particle beam apparatus according to the system described herein.

In the embodiment as shown in FIG. 8, the first deflection device 9 and the second deflection device 12 are used as the electrostatic and/or magnetic deflection unit. When this deflection unit of the SEM 100 is set, the scanning region is shifted in such a way that the first irradiation direction corresponds to the second irradiation direction. Then the first beam path SV1, along which the primary electron beam PE1 runs in the first mode of operation of the SEM 100, and the second beam path SV2, along which the primary electron beam PE2 runs in the second mode of operation of the SEM 100, are aligned with each other. Both the primary electron beam PE1 in the first mode of operation of the SEM 100 and the second primary electron beam PE2 in the second mode of operation of the SEM 100 are incident on the surface of the object 15 at the same position corresponding to the predeterminable position VP.

The system described herein recognizes that application of the method, referred to as "rocking beam", in different modes of operation of the SEM 100 allows the different beam paths SV1 and SV2 caused by the different modes of operation of the SEM 100 to be aligned with each other or be mergeable. The system described herein ensures that, in the different modes of operation, the primary electron beam PE1 and PE2 firstly is guided to the same location (specifically the predeterminable position VP) on the object 15 and secondly has the same orientation with respect to the object 15, so that the same lattice plane of a crystal lattice of the object 15 is measured in a crystalline object 15.

All the embodiments of the method according to the invention described herein are not restricted to the mentioned sequence of the method steps. The invention also includes different sequences of the method steps which are suitable for solving the problem within the meaning of the invention. In an alternative to that or in addition, the method according to the invention also provides for the parallel implementation of at least two method steps. Furthermore, the embodiments of the method according to the invention described herein are not restricted to the complete scope of all the method steps mentioned above or further below. In particular, provision is made for individual or a plurality of the method steps described herein to be omitted in further embodiments.

The features of the invention that are disclosed in the present description, in the drawings and in the claims may be essential for the implementation of the invention in its various embodiments both individually and in any desired combinations. The invention is not restricted to the described embodiments. The invention can be varied within the scope of the claims and taking into account the knowledge of those skilled in the relevant art.

The invention claimed is:

1. A method for operating a particle beam apparatus for processing, imaging and/or analyzing an object, the method comprising:

generating a particle beam using a beam generator of the particle beam apparatus, the particle beam having charged particles;

selecting at least one value of at least one control parameter for controlling at least one functional unit of the particle beam apparatus using a control device;

controlling the functional unit with the value of the control parameter using the control device of the particle beam apparatus, wherein the particle beam is guided along a first beam path of the particle beam apparatus from the beam generator, in the direction of the object;

guiding the particle beam to a location of a scanning region on the surface of the object using a first guide device provided for guiding the particle beam and a second guide device provided for guiding the particle beam, wherein, as viewed from the beam generator in the direction of the object, the first guide device is arranged on and/or in the particle beam apparatus first, followed by the second guide device, wherein the first guide device guides the particle beam away from an optical axis of the particle beam apparatus at a first angle to the optical axis, wherein the second guide device guides the particle beam in a direction of the optical axis at a second angle to the optical axis, wherein, when guiding the particle beam to the location, the first angle runs through a first predeterminable value range and the second angle runs through a second predeterminable value range;

detecting first interaction particles and/or a first interaction radiation using at least one detector, wherein the first interaction particles and/or the first interaction radiation result/results from an interaction of the particle beam with the object when the particle beam is incident on the object;

generating first detection signals using the detected first interaction particles and/or the detected first interaction radiation;

generating a first image of the object using the first detection signals and using the control device;

selecting at least one value of a further control parameter for controlling the functional unit;

controlling the functional unit with the value of the further control parameter using the control device, wherein the particle beam is guided along a second beam path of the particle beam apparatus from the beam generator in the direction of the object;

guiding the particle beam to the location on the surface of the object using the first guide device and the second guide device, wherein the first guide device guides the particle beam away from the optical axis at a third angle to the optical axis, wherein the second guide device guides the particle beam in the direction of the optical axis at a fourth angle to the optical axis, wherein, when guiding the particle beam to the location, the third angle runs through a third predeterminable value range and the fourth angle runs through a fourth predeterminable value range;

detecting second interaction particles and/or a second interaction radiation using the detector, wherein the second interaction particles and/or the second interaction radiation result/results from an interaction of the particle beam with the object when the particle beam is incident on the object;

generating second detection signals using the detected second interaction particles and/or the detected second interaction radiation;

generating a second image of the object using the second detection signals by means of and using the control device; and setting, using the control device, the size and/or shape of an opening and/or position of an aperture unit of the particle beam apparatus, and/or at least one electrostatic and/or magnetic deflection unit of the particle beam apparatus for displacing the scanning region such that a first irradiation direction of the particle beam in the direction of the location on the surface of the object corresponds to a second irradiation direction of the particle beam in the direction of the location on the surface of the object, wherein the first irradiation direction is ascertained from the first image and wherein the second irradiation direction is ascertained from the second image.

2. The method according to claim 1, wherein the value of the control parameter is a first value and wherein the value of the further control parameter is a second value, the method further comprising:

using the control parameter as the further control parameter.

3. The method according to claim 1, wherein the first angle is used as the second angle and/or the third angle is used as the fourth angle.

4. The method according to claim 1, wherein the first predeterminable value ranges between 0° and 90°, the second predeterminable value ranges between 0° and 90°, the third predeterminable value ranges between 0° and 90°, the fourth predeterminable value ranges between 0° and 90°, the first predeterminable value range as equals the second predeterminable value range, and/or using the third predeterminable value range equals the fourth predeterminable value range.

5. The method according to claim 1, wherein the beam generator is the functional unit in order to set a particle current of the particle beam supplied to the object, using the aperture unit is the functional unit in order to set a convergence angle of the particle beam, a first condenser lens of the particle beam apparatus is the functional unit, and/or a second condenser lens of the particle beam apparatus is the functional unit.

6. The method according to claim 1, wherein backscatter particles are detected as first interaction particles, backscatter particles are detected as second interaction particles, backscattered electrons are detected as first interaction particles, and/or backscattered electrons are detected as second interaction particles.

7. A non-transitory computer readable medium containing software which is loadable into a processor and which, when executed, causes a particle beam apparatus to perform the following steps:

generating a particle beam using a beam generator of the particle beam apparatus, the particle beam having charged particles;

selecting at least one value of at least one control parameter for controlling at least one functional unit of the particle beam apparatus using a control device;

controlling the functional unit with the value of the control parameter using the control device of the particle beam apparatus, wherein the particle beam is guided along a first beam path of the particle beam apparatus from the beam generator in the direction of the object;

guiding the particle beam to a location of a scanning region on the surface of the object using a first guide device provided for guiding the particle beam and a second guide device provided for guiding the particle beam, wherein, as viewed from the beam generator in the direction of the object, the first guide device is arranged on and/or in the particle beam apparatus first, followed by the second guide device, wherein the first guide device guides the particle beam away from an optical axis of the particle beam apparatus at a first angle to the optical axis, wherein the second guide device guides the particle beam in a direction of the optical axis at a second angle to the optical axis, wherein, when guiding the particle beam to the location, the first angle runs through a first predeterminable value range and the second angle runs through a second predeterminable value range;

detecting first interaction particles and/or a first interaction radiation using at least one detector, wherein the first interaction particles and/or the first interaction radiation result/results from an interaction of the particle beam with the object when the particle beam is incident on the object;

generating first detection signals using the detected first interaction particles and/or the detected first interaction radiation;

generating a first image of the object using the first detection signals and using the control device;

selecting at least one value of a further control parameter for controlling the functional unit;

controlling the functional unit with the value of the further control parameter using the control device, wherein the particle beam is guided along a second beam path of the particle beam apparatus from the beam generator in the direction of the object;

guiding the particle beam to the location on the surface of the object using the first guide device and the second guide device, wherein the first guide device guides the particle beam away from the optical axis at a third angle to the optical axis, wherein the second guide device guides the particle beam in the direction of the optical axis at a fourth angle to the optical axis, wherein, when guiding the particle beam to the location, the third angle runs through a third predeterminable value range and the fourth angle runs through a fourth predeterminable value range;

detecting second interaction particles and/or a second interaction radiation using the detector, wherein the second interaction particles and/or the second interaction radiation result/results from an interaction of the particle beam with the object when the particle beam is incident on the object;

generating second detection signals using the detected second interaction particles and/or the detected second interaction radiation;

generating a second image of the object using the second detection signals and using the control device; and setting, using the control device, the size and/or shape of an opening and/or position of an aperture unit of the particle beam apparatus, and/or at least one electrostatic and/or magnetic deflection unit of the particle beam apparatus for displacing the scanning region such that a first irradiation direction of the particle beam in the direction of the location on the surface of the object corresponds to a second irradiation direction of the particle beam in the direction of the location on the surface of the object, wherein the first irradiation direction is ascertained from the first image and wherein the second irradiation direction is ascertained from the second image.

8. A particle beam apparatus for processing, imaging and/or analyzing an object, comprising:

at least one beam generator that generates a particle beam with charged particles;

at least one aperture unit for setting the particle beam;

at least one functional unit for generating, setting, guiding and/or shaping the particle beam;

at least one first guide device for guiding the particle beam;

at least one second guide device for guiding the particle beam;

at least one detector for detecting interaction particles and/or interaction radiation which result/results from an interaction of the particle beam with the object when the particle beam is incident on the object;

at least one electrostatic and/or magnetic deflection unit; and at least one control device having a processor coupled to a non-transitory computer readable medium containing software which is loadable into the processor and which, when executed, causes the particle beam apparatus to perform the following steps:

generating a particle beam using a beam generator of the particle beam apparatus, the particle beam having charged particles;

selecting at least one value of at least one control parameter for controlling at least one functional unit of the particle beam apparatus using a control device;

controlling the functional unit with the value of the control parameter using the control device of the particle beam apparatus, wherein the particle beam is guided along a first beam path of the particle beam apparatus from the beam generator in the direction of the object;

guiding the particle beam to a location of a scanning region on the surface of the object using a first guide device provided for guiding the particle beam and a second guide device provided for guiding the particle beam, wherein, as viewed from the beam generator in the direction of the object, the first guide device is arranged on and/or in the particle beam apparatus first, followed by the second guide device, wherein the first guide device guides the particle beam away from an optical axis of the particle beam apparatus at a first angle to the optical axis, wherein the second guide device guides the particle beam in a direction of the optical axis at a second angle to the optical axis, wherein, when guiding the particle beam to the location, the first angle runs through a first predeterminable value range and the second angle runs through a second predeterminable value range;

detecting first interaction particles and/or a first interaction radiation using at least one detector, wherein the first interaction particles and/or the first interaction radiation result/results from an interaction of the particle beam with the object when the particle beam is incident on the object;

generating first detection signals using the detected first interaction particles and/or the detected first interaction radiation;

generating a first image of the object using the first detection signals and using the control device;

selecting at least one value of a further control parameter for controlling the functional unit;

controlling the functional unit with the value of the further control parameter using the control device, wherein the particle beam is guided along a second beam path of the particle beam apparatus from the beam generator in the direction of the object;

guiding the particle beam to the location on the surface of the object using the first guide device and the second guide device, wherein the first guide device guides the particle beam away from the optical axis at a third angle to the optical axis, wherein the second guide device guides the particle beam in the direction of the optical axis at a fourth angle to the optical axis, wherein, when guiding the particle beam to the location, the third angle runs through a third predeterminable value range and the fourth angle runs through a fourth predeterminable value range;

detecting second interaction particles and/or a second interaction radiation using the detector, wherein the second interaction particles and/or the second interaction radiation result/results from an interaction of the particle beam with the object when the particle beam is incident on the object;

generating second detection signals using the detected second interaction particles and/or the detected second interaction radiation;

generating a second image of the object using the second detection signals and using the control device; and setting, using the control device, the size and/or shape of an opening and/or position of an aperture unit of the particle beam apparatus, and/or at least one electrostatic and/or magnetic deflection unit of the particle beam apparatus for displacing the scanning region such that a first irradiation direction of the particle beam in the direction of the location on the surface of the object corresponds to a second irradiation direction of the particle beam in the direction of the location on the surface of the object, wherein the first irradiation direction is ascertained from the first image and wherein the second irradiation direction is ascertained from the second image.

9. The particle beam apparatus according to claim 8, wherein the particle beam apparatus includes at least one scanning device for raster-scanning the particle beam over the object, and wherein the scanning device includes the first guide device and the second guide device.

10. The particle beam apparatus according to claim 8, wherein the particle beam apparatus includes at least one objective lens that focuses the particle beam on the object.

11. The particle beam apparatus according to claim 10, wherein the beam generator is a first beam generator and the particle beam is a first particle beam with first charged particles, wherein the objective lens is a first objective lens that focuses the first particle beam on the object, the particle beam apparatus further comprising:

at least one second beam generator that generates a second particle beam with second charged particles; and at least one second objective lens that focuses the second particle beam on the object.

12. The particle beam apparatus according to any claim 8, wherein the electrostatic and/or magnetic deflection unit includes one condenser lens or a plurality of condenser lenses.

13. The particle beam apparatus according to any claim 8, wherein the particle beam apparatus is an electron beam apparatus and/or an ion beam apparatus.

* * * * *